(12) United States Patent
Gyoda et al.

(10) Patent No.: US 9,551,926 B2
(45) Date of Patent: Jan. 24, 2017

(54) DETERMINATION METHOD, STORAGE MEDIUM AND INFORMATION PROCESSING APPARATUS

(75) Inventors: Yuichi Gyoda, Utsunomiya (JP); Koji Mikami, Nikko (JP); Kouichirou Tsujita, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 846 days.

(21) Appl. No.: 13/534,059

(22) Filed: Jun. 27, 2012

(65) Prior Publication Data
US 2013/0010272 A1    Jan. 10, 2013

(30) Foreign Application Priority Data

Jul. 5, 2011    (JP) .................................. 2011-149496

(51) Int. Cl.
G03B 27/68    (2006.01)
G03F 1/50    (2012.01)
G03F 7/20    (2006.01)

(52) U.S. Cl.
CPC .................. *G03F 1/50* (2013.01); *G03F 7/705* (2013.01)

(58) Field of Classification Search
CPC .................................. G03F 1/50; G03F 7/705
USPC ........................................................ 355/52, 55
See application file for complete search history.

(56) References Cited

U.S. PATENT DOCUMENTS

| | | | | |
|---|---|---|---|---|
| 6,128,067 A | * | 10/2000 | Hashimoto | G03F 1/144 355/52 |
| 6,738,859 B2 | * | 5/2004 | Liebchen | G03F 1/144 430/5 |
| 7,034,919 B2 | | 4/2006 | Liebchen | |
| 8,049,191 B2 | * | 11/2011 | Tsujita | G03F 7/70141 250/492.22 |

(Continued)

FOREIGN PATENT DOCUMENTS

| | | |
|---|---|---|
| CN | 1510520 A | 7/2004 |
| CN | 1530755 A | 9/2004 |

(Continued)

OTHER PUBLICATIONS

Taiwanese OA cited in counterpart appl No. TW101123500 dated Apr. 7, 2014.

(Continued)

*Primary Examiner* — Deoram Persaud
(74) *Attorney, Agent, or Firm* — Rossi, Kimms & McDowell LLP

(57) ABSTRACT

The present invention provides a determination method of determining exposure conditions of an exposure apparatus including an illumination optical system which illuminates a mask, and a projection optical system which projects a pattern of the mask onto a substrate, the method including a step of setting an illumination parameter for a light intensity distribution formed on a pupil plane of the illumination optical system, and an aberration parameter for an aberration of the projection optical system, and a step of determining a value of the illumination parameter and a value of the aberration parameter so that an image performance of an optical image of the pattern of the mask satisfies an evaluation criterion set for a target pattern to be formed on an image plane of the projection optical system.

11 Claims, 16 Drawing Sheets

(56) References Cited

U.S. PATENT DOCUMENTS

| | | | |
|---|---|---|---|
| 8,893,060 B2* | 11/2014 | Feng | G03F 1/70 716/51 |
| 2002/0195538 A1* | 12/2002 | Dowsk, Jr. | G02B 27/0025 250/201.2 |
| 2004/0008329 A1* | 1/2004 | Nakae | G03B 27/42 355/53 |
| 2005/0028129 A1* | 2/2005 | Hsu | G03F 1/144 716/53 |
| 2005/0254024 A1* | 11/2005 | Marie Van Greevenbroek | G03F 7/70891 355/30 |
| 2006/0068301 A1* | 3/2006 | Hirukawa | G03F 7/70258 430/5 |
| 2006/0190850 A1* | 8/2006 | Kohle | G03F 1/144 716/53 |
| 2007/0013896 A1 | 1/2007 | Tsujita | |
| 2008/0226152 A1* | 9/2008 | Dirksen | G03F 7/70608 382/141 |
| 2009/0310116 A1* | 12/2009 | Tsujita | G03F 7/70083 355/77 |
| 2011/0107277 A1* | 5/2011 | Tsujita | G03F 1/144 716/50 |
| 2011/0181855 A1* | 7/2011 | Bittner | G03F 7/70266 355/55 |
| 2012/0075614 A1* | 3/2012 | Gyoda | G03F 7/706 355/77 |
| 2012/0233574 A1* | 9/2012 | Gyoda | G03F 7/70125 716/51 |
| 2013/0268902 A1* | 10/2013 | Arai | G06F 17/50 716/53 |
| 2013/0342819 A1* | 12/2013 | Takeshita | G03F 7/70141 355/67 |
| 2014/0146311 A1* | 5/2014 | Mikami | G03F 7/70483 356/73 |

FOREIGN PATENT DOCUMENTS

| | | |
|---|---|---|
| CN | 1896877 A | 1/2007 |
| CN | 101221372 A | 7/2008 |
| CN | 101551594 A | 10/2009 |
| CN | 102053503 A | 5/2011 |
| JP | 2007027418 A | 2/2007 |
| JP | 4606732 B2 | 1/2011 |
| TW | 200715372 A | 4/2007 |
| WO | 02054036 A1 | 7/2002 |

OTHER PUBLICATIONS

Chinese Office Action for corresponding CN 201210231564.7, mail date Jan. 6, 2014. English translation provided.

Office Action issued in JP2011-149496, mailed Jun. 8, 2015.

* cited by examiner

F I G. 12A
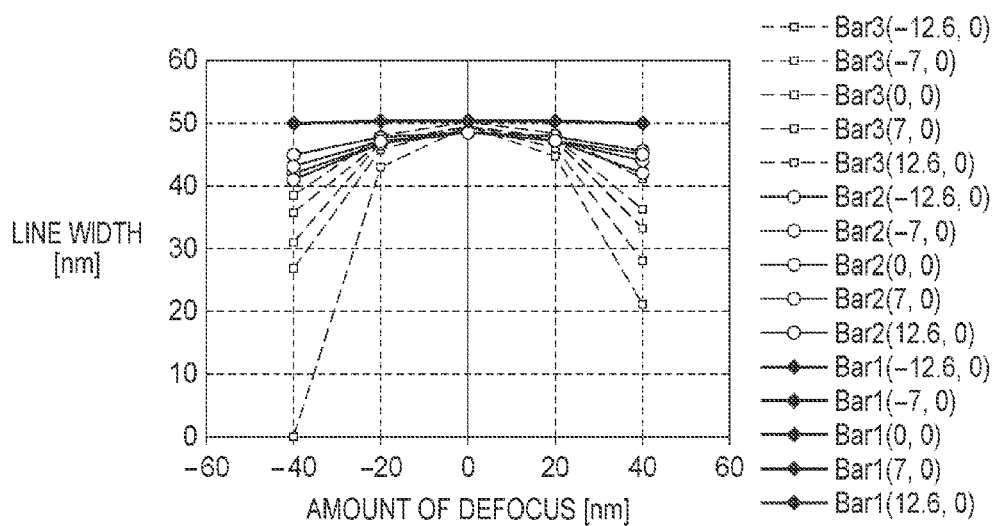
F I G. 12B
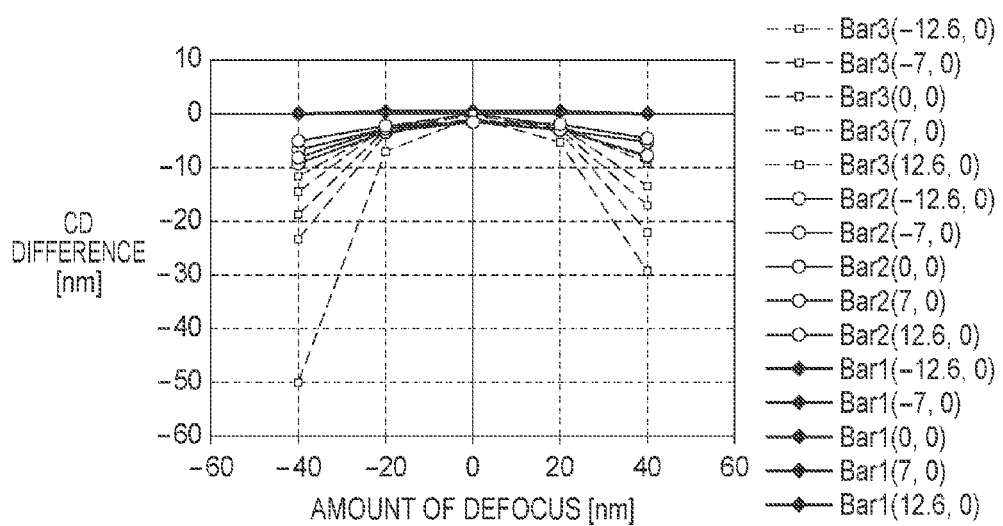

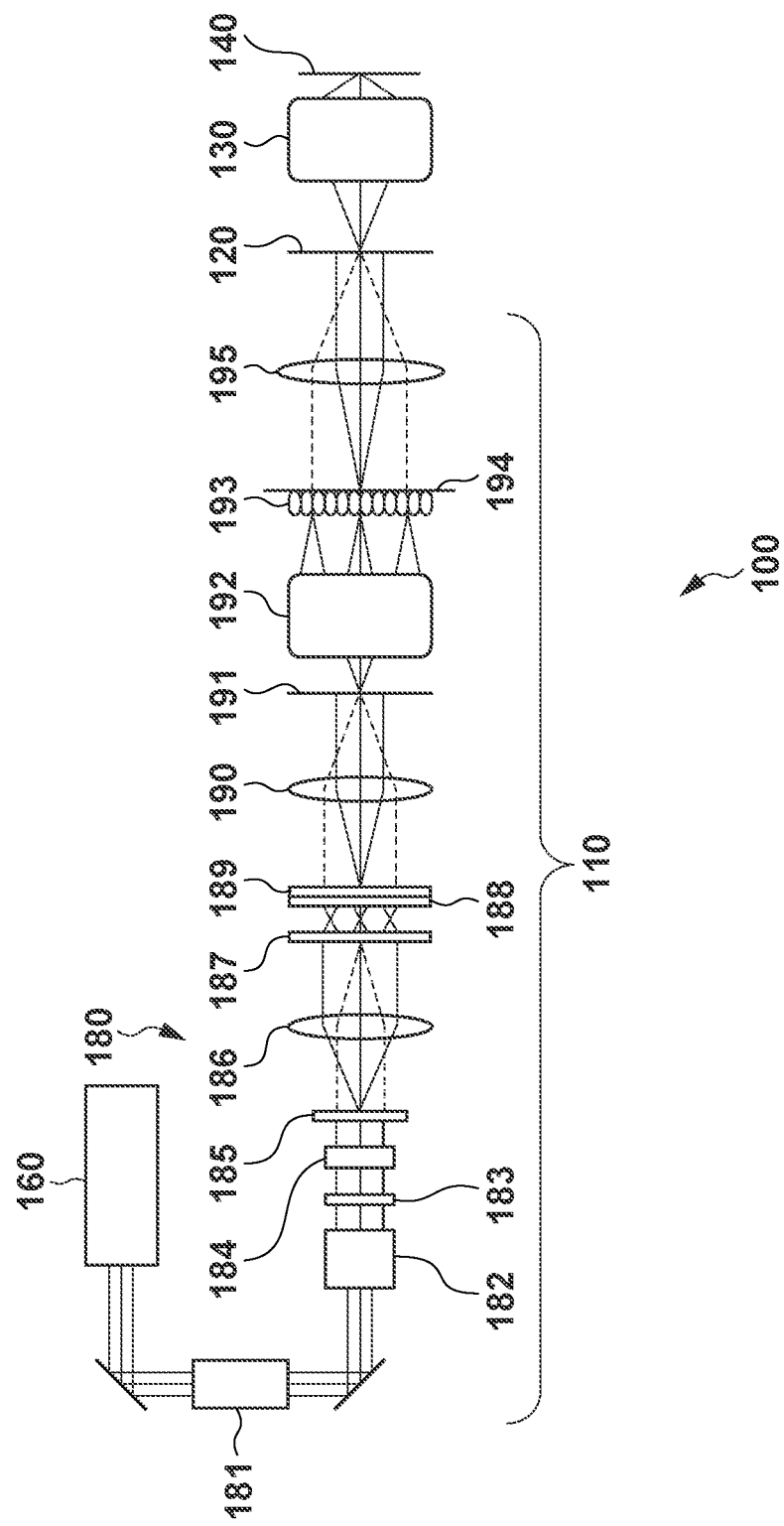

DETERMINATION METHOD, STORAGE MEDIUM AND INFORMATION PROCESSING APPARATUS

BACKGROUND OF THE INVENTION

Field of the Invention

The present invention relates to a determination method of determining the exposure conditions of an exposure apparatus, a storage medium, and an information processing apparatus.

Description of the Related Art

An exposure apparatus which projects and transfers the pattern of a mask (reticle) onto a substrate (for example, a wafer) via a projection optical system is employed to fabricate a semiconductor device using a photolithography technique. In recent years, with miniaturization of semiconductor devices (that is, with a reduction in circuit line width), a demand has arisen for a technique which further improves the resolution of the exposure apparatus.

The exposure apparatus is required to transfer the pattern (its image) of a mask to a desired position on a substrate in a desired shape. However, due to some error factors during exposure, the mask pattern is often transferred to a position deviated from the desired position in a shape deviated from the desired shape. Examples of the error factors include the amount of exposure and the focus position in exposing the substrate. Note that examples of factors which cause the amount of exposure to deviate from an ideal state include instability of a light source and nonuniformity of the illuminance distribution in the illumination region. Examples of factors which cause the focus position to deviate from an ideal state include instability of the position at which the substrate is held, and unevenness of the substrate.

Also, the aberration of the projection optical system is one of the above-mentioned error factors. The projection optical system includes an aberration adjusting mechanism for adjusting (correcting) its aberration, as disclosed in International Publication WO 02/054036. International Publication WO 02/054036 discloses an aberration adjusting mechanism for adjusting the aberration of the projection optical system by driving an optical element, which forms the projection optical system, in an amount corresponding to the wavefront aberration of light having passed through the projection optical system. Such an aberration adjusting mechanism mainly has a function of adjusting low-order aberrations and is used to suppress generation of low-order aberrations and compensate for a temporal change in aberration. The aberration adjusting mechanism is also sometimes used to suppress the differences in image performance among individual image heights because the aberration exhibits different characteristics for each image height of the projection optical system. However, the capability of the aberration adjusting mechanism has a given limit, so the projection optical system generally has residual aberrations. Also, the amount of residual aberrations and the amount of fluctuation in aberration (that is, the amount of fluctuation in residual aberration due, for example, to exposure heat) during exposure vary in each individual exposure apparatus.

On the other hand, to further improve the resolution of an exposure apparatus, Japanese Patent No. 4606732 proposes a technique of optimizing (determining) the exposure conditions of the exposure apparatus. As an example of this technique, a technique (called the "SMO technique") of optimizing both the mask pattern (its dimension and shape) and the effective light source shape (the light intensity distribution formed on the pupil plane of an illumination optical system) is available. In the general SMO technique, the mask pattern and the effective light source shape are adjusted to satisfy a reference value (target value) for the image performance such as the line width. Japanese Patent No. 4606732 also discloses a technique of optimizing the effective light source shape after setting a specific value (a nonzero value such as a value corresponding to residual aberrations) to the aberration of the projection optical system. As described above, the SMO technique of optimizing the effective light source shape and the mask pattern in consideration of the aberration of the projection optical system is available.

However, the conventional SMO technique which takes into consideration of the aberration of the projection optical system simply optimizes the effective light source shape and the mask pattern so as to compensate for the influence that the aberration of the projection optical system exerts on the image performance. Therefore, if simply adjusting the effective light source shape and the mask pattern is insufficient to compensate for the influence that the aberration of the projection optical system exerts on the image performance, it is impossible to determine the effective light source shape and the mask pattern so that the image performance satisfies the reference value. Since such a problem becomes conspicuous as miniaturization of semiconductor devices progresses, the conventional SMO technique is becoming insufficient to optimize the exposure conditions.

SUMMARY OF THE INVENTION

The present invention provides a technique advantageous in determining the exposure conditions of an exposure apparatus.

According to one aspect of the present invention, there is provided a determination method of determining exposure conditions of an exposure apparatus including an illumination optical system which illuminates a mask, and a projection optical system which projects a pattern of the mask onto a substrate, the method including a first step of setting an illumination parameter for a light intensity distribution formed on a pupil plane of the illumination optical system, and an aberration parameter for an aberration of the projection optical system, and a second step of determining a value of the illumination parameter and a value of the aberration parameter so that an image performance of an optical image of the pattern of the mask, which is formed in an image plane of the projection optical system in correspondence with the pattern of the mask to be placed on an object plane of the projection optical system, satisfies an evaluation criterion set for a target pattern to be formed on the image plane of the projection optical system, thereby determining, as the exposure conditions, the light intensity distribution formed on the pupil plane of the illumination optical system and the aberration of the projection optical system, which are defined by the determined value of the illumination parameter and the determined value of the aberration parameter, respectively.

Further features of the present invention will become apparent from the following description of exemplary embodiments with reference to the attached drawings.

BRIEF DESCRIPTION OF THE DRAWINGS

FIGS. 12A and 12B are graphs each showing the image performance characteristics of optical images, formed on the image plane of a projection optical system, at the evaluation positions in correspondence with the parameters before optimization in the third embodiment.

FIG. 16 is a schematic block diagram showing the configuration of an exposure apparatus.

DESCRIPTION OF THE EMBODIMENTS

Figure 1:
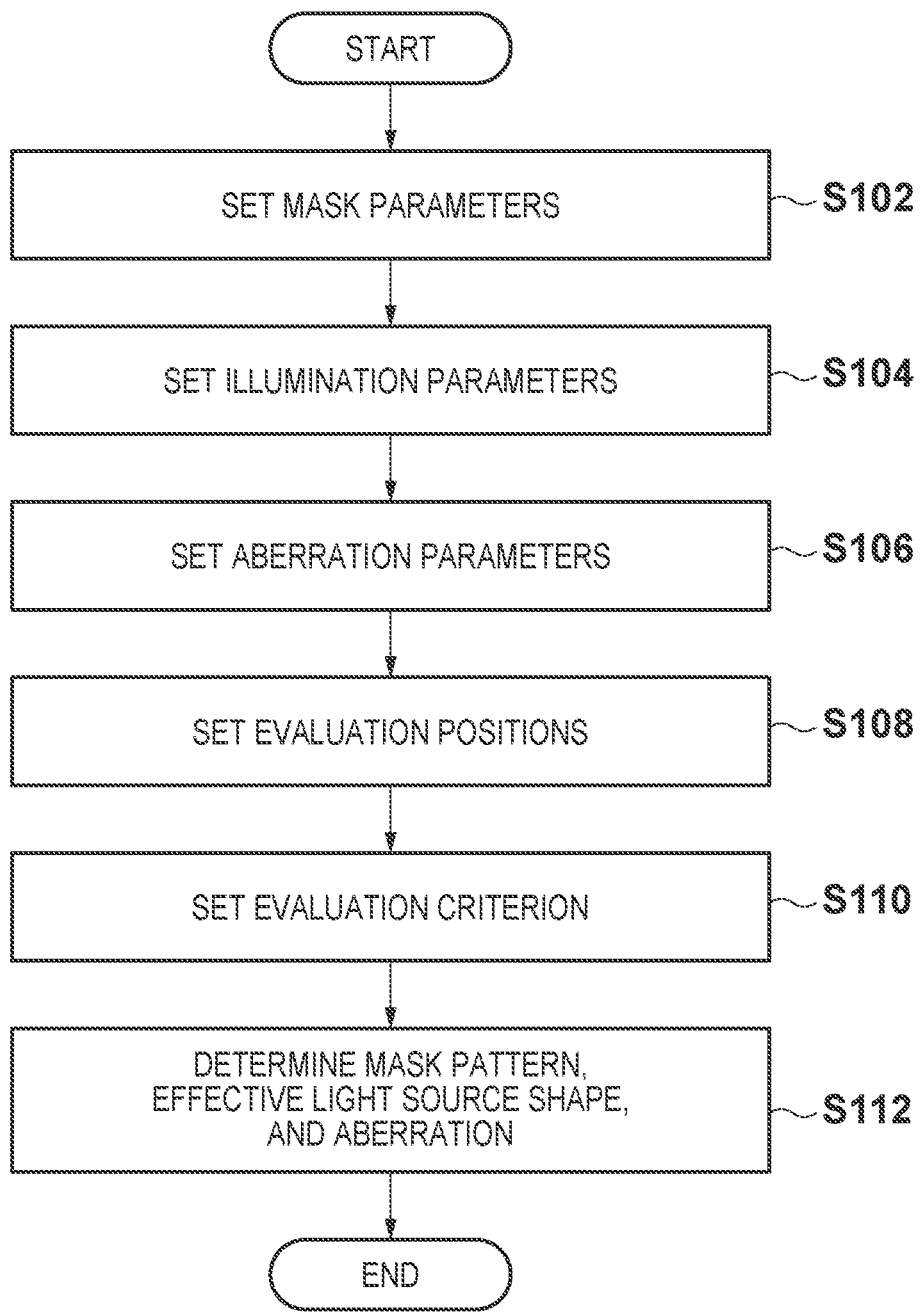
FIG. 1 is a flowchart for explaining a determination method according to the first embodiment of the present invention.

Preferred embodiments of the present invention will be described below with reference to the accompanying drawings. Note that the same reference numerals denote the same members throughout the drawings, and a repetitive description thereof will not be given.

The inventors of the present invention found that in optimizing the exposure conditions of an exposure apparatus, the aberration of a projection optical system must also be defined as a target to be optimized as with the effective light source shape (the light intensity distribution formed on the pupil plane of an illumination optical system) and the mask pattern. The aberration of the projection optical system can be controlled using, for example, the aberration adjusting mechanism disclosed in Pamphlet of International Publication WO 02/054036. Therefore, as with the effective light source shape and the mask pattern, the aberration of the projection optical system can be defined as a target to be optimized to improve the image performance of an optical image of the mask pattern, which is formed on the image plane of the projection optical system.

In general, as long as the effective light source shape and the mask pattern are determined, it is possible to specify the position in the pupil plane of the projection optical system, through which light (exposure light) passes upon illumination of this mask pattern using this effective light source shape. The aberration of the projection optical system represents a change in phase of a light beam at each position in the pupil plane, and is closely related to the effective light source shape and the mask pattern in terms of forming an optical image. Therefore, in this embodiment, not only the effective light source shape and the mask pattern but also the aberration of the projection optical system is defined as a target to be optimized, thereby providing a technique advantageous in optimizing the exposure conditions of the exposure apparatus.

<First Embodiment>

FIG. 1 is a flowchart for explaining a determination method according to the first embodiment of the present invention. The determination method of this embodiment is executed by an information processing apparatus such as a computer to determine (optimize) the exposure conditions of an exposure apparatus including an illumination optical system which illuminates a mask (reticle), and a projection optical system which projects the pattern of the mask onto a substrate. Note that the exposure conditions can be set in the exposure apparatus, and include, for example, parameters such as the shape, size, and position of the pattern (mask pattern) of the mask, the effective light source shape, and the aberration of the projection optical system.

In step S102, parameters (mask parameters) are set for the pattern of a mask to be placed on the object plane of the projection optical system.

Figure 2:
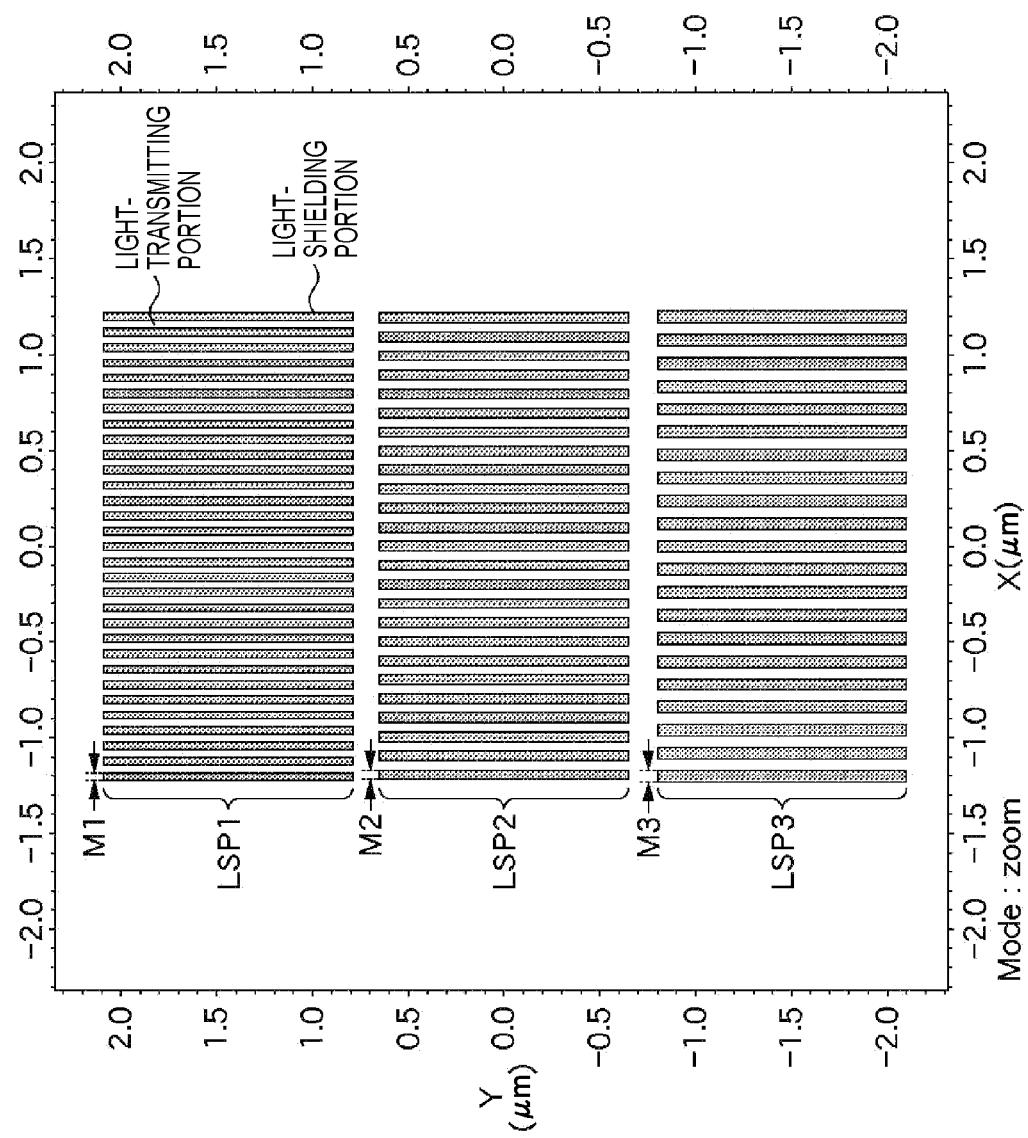
FIG. 2 is a view illustrating an example of mask parameters set in step S102 shown in FIG. 1.

In this embodiment, mask parameters (also called "mask biases") M1, M2, and M3 which define the shape of a mask pattern shown in FIG. 2 are set. The mask pattern shown in FIG. 2 includes three types of line-and-space patterns LSP1, LSP2, and LSP3 formed by light-shielding portions (transmittance: 0%) and light-transmitting portions (transmittance: 100%). The mask parameter M1 defines the dimension (width) of the line pattern of the line-and-space pattern LSP1 having a half pitch of 40 nm. The mask parameter M2 defines the dimension (width) of the line pattern of the line-and-space pattern LSP2 having a half pitch of 50 nm. The mask parameter M3 defines the dimension (width) of the line-and-space pattern LSP3 having a half pitch of 60 nm. Also, in this embodiment, the following upper and lower limits are defined for the mask parameters M1, M2, and M3 in terms of mask manufacturability as:

$35 \leq M1 \leq 45$ (nm)

$45 \leq M2 \leq 60$ (nm)

$55 \leq M3 \leq 75$ (nm)

A general mask pattern includes various patterns. In step S102, mask parameters may be set for all patterns included in the mask pattern or for some of them. Also, although the mask pattern uses line-and-space patterns in this embodiment, it may use other patterns (for example, hole patterns). Moreover, although the mask pattern is defined by a binary mask in this embodiment, it may be defined by a phase shift mask or other types of masks.

Also, in this embodiment, the widths of the line patterns of the line-and-space patterns are set as mask parameters. However, the lengths (longitudinal dimensions) of the line patterns of the line-and-space patterns or the amounts associated with the vertex positions of the mask pattern may be set as mask parameters. Further, the transmittance or phase of the mask pattern, for example, can also be set as a mask parameter.

In step S104, parameters (illumination parameters) are set for the light intensity distribution formed on the pupil plane of the illumination optical system, that is, the effective light source shape.

Figure 3:
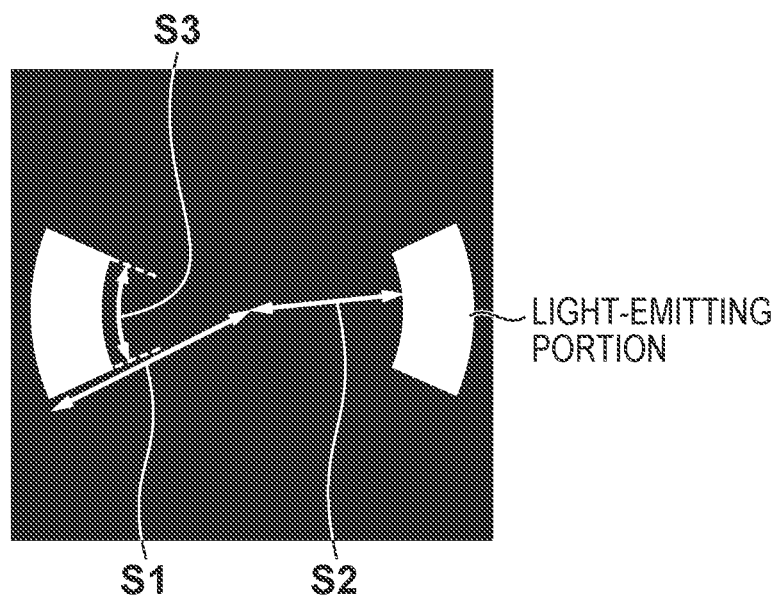
FIG. 3 is a view illustrating an example of illumination parameters set in step S104 shown in FIG. 1.

In this embodiment, illumination parameters S1, S2, and S3 which define the shape of dipole illumination shown in FIG. 3 are set. The dipole illumination shown in FIG. 3 includes two light-emitting portions and is suitable for line-and-space patterns. The illumination parameter S1 defines the outer sigma of the dipole illumination. The illumination parameter S2 defines the inner sigma of the dipole illumination. The illumination parameter S3 defines the angle of aperture of the light-emitting portions of the dipole illumination. Also, in this embodiment, the following upper and lower limits are defined for the illumination parameters S1, S2, and S3 as:

$0.80 \leq S1 \leq 0.95$
$0.50 \leq S2 \leq 0.90$
$10 \leq S3 \leq 50$ (°)

Although illumination parameters are set for dipole illumination suitable for the mask pattern shown in FIG. 2 in this embodiment, they may be set for illumination having other shapes. For example, illumination parameters (for example, the outer and inner sigma values) may be set for annular illumination, or illumination parameters (the outer and inner sigma values, the angle of aperture of the light-emitting portions, and the angle of rotation of these light-emitting portions) may be set for cross-pole illumination. Illumination parameters having very large degrees of freedom can also be set. For example, the light emission intensities of a plurality of element light sources obtained by dividing the pupil plane of the illumination optical system in a matrix may be set as independent illumination parameters.

Although the numerical aperture (NA) of the projection optical system is set (fixed) to 1.35, the wavelength of exposure light is set (fixed) to 193 nm, and the polarization state of the exposure light is set (fixed) to linear polarization in the Y-direction in this embodiment, they may be set as illumination parameters. In other words, a parameter for the NA of the projection optical system, that for the wavelength of exposure light, and that for the degree of polarization of the exposure light, for example, may be set as illumination parameters.

In step S106, parameters (aberration parameters) are set for the aberration of the projection optical system. The aberration of the projection optical system is generally defined as a wavefront aberration represented by Zernike polynomials. When, for example, the first to 36th terms of Zernike polynomials are used, one wavefront aberration (its shape) can be defined by setting (inputting) 36 coefficients for the first to 36th terms. Also, the coefficients of the respective terms of the Zernike polynomials are commonly called C1, C2, C3, . . . , Cn in ascending order from the first term.

C1 is a uniform component, which is not included in the wavefront aberration and need not be used. C2 and C3 represent uniform distortions, which need not be used when attention is paid to the line width of the central pattern of a line-and-space pattern (to be described later, together with a description of step S108), as in this embodiment. Also, C4 corresponds to defocus of the projection optical system. In this embodiment, as in steps S110 and S112, since optical images are calculated at a plurality of focus positions to evaluate a process window, C4 need not be used as the wavefront aberration. Therefore, in this embodiment, the coefficients C5, C6, C7, C8, and C9 of the fifth to ninth terms of the Zernike polynomials are set as aberration parameters. The fifth to ninth terms (C5 to C9) of the Zernike polynomials are often called "low-order" wavefront aberrations, amounts of which can more easily be controlled by the aberration adjusting mechanism provided in the projection optical system than those of "high-order" wavefront aberrations in the 10th (C10) and subsequent terms. In this embodiment, the adjustment ranges of the amounts of aberrations (unit: mλ) with respect to the wavelength (unit: λ) of exposure light are defined for the coefficients C5, C6, C7, C8, and C9 as:

$-30 \leq C5 \leq 30$ (mλ)
$-30 \leq C6 \leq 30$ (mλ)
$-30 \leq C7 \leq 30$ (mλ)
$-30 \leq C8 \leq 30$ (mλ)
$-30 \leq C9 = 30$ (mλ)

Also, in this embodiment, zero is input to the coefficients C1 to C4 of the first to fourth terms of the Zernike polynomials, and values corresponding to the actual residual aberrations of the projection optical system are input to the coefficients C10 to C36 of the 10th to 36th terms, as shown in Table 1.

TABLE 1

| C 10 | C 11 | C 12 | C 13 | C 14 | C 15 | C 16 | C 17 | C 18 | C 19 | C 20 | C 21 | C 22 | C 23 |
|---|---|---|---|---|---|---|---|---|---|---|---|---|---|
| −4.4 | −7.6 | 9.2 | 2.2 | −14 | −3 | 18.4 | 9.6 | −3.2 | −1.2 | −3.4 | 7.4 | −0.6 | −7 |
| C 24 | C 25 | C 26 | C 27 | C 28 | C 29 | C 30 | C 31 | C 32 | C 33 | C 34 | C 35 | C 36 | |
| 2.6 | −3.6 | 4.2 | −2.4 | 0.4 | 0.2 | −3.2 | −0.4 | 1.4 | −3 | 7.6 | 0.2 | −3 | |

(unit: mλ)

This makes it possible to use low-order wavefront aberrations to adjust high-order wavefront aberrations that can hardly be adjusted, thereby confirming whether an optical image having excellent image performance can be formed.

Figure 4:
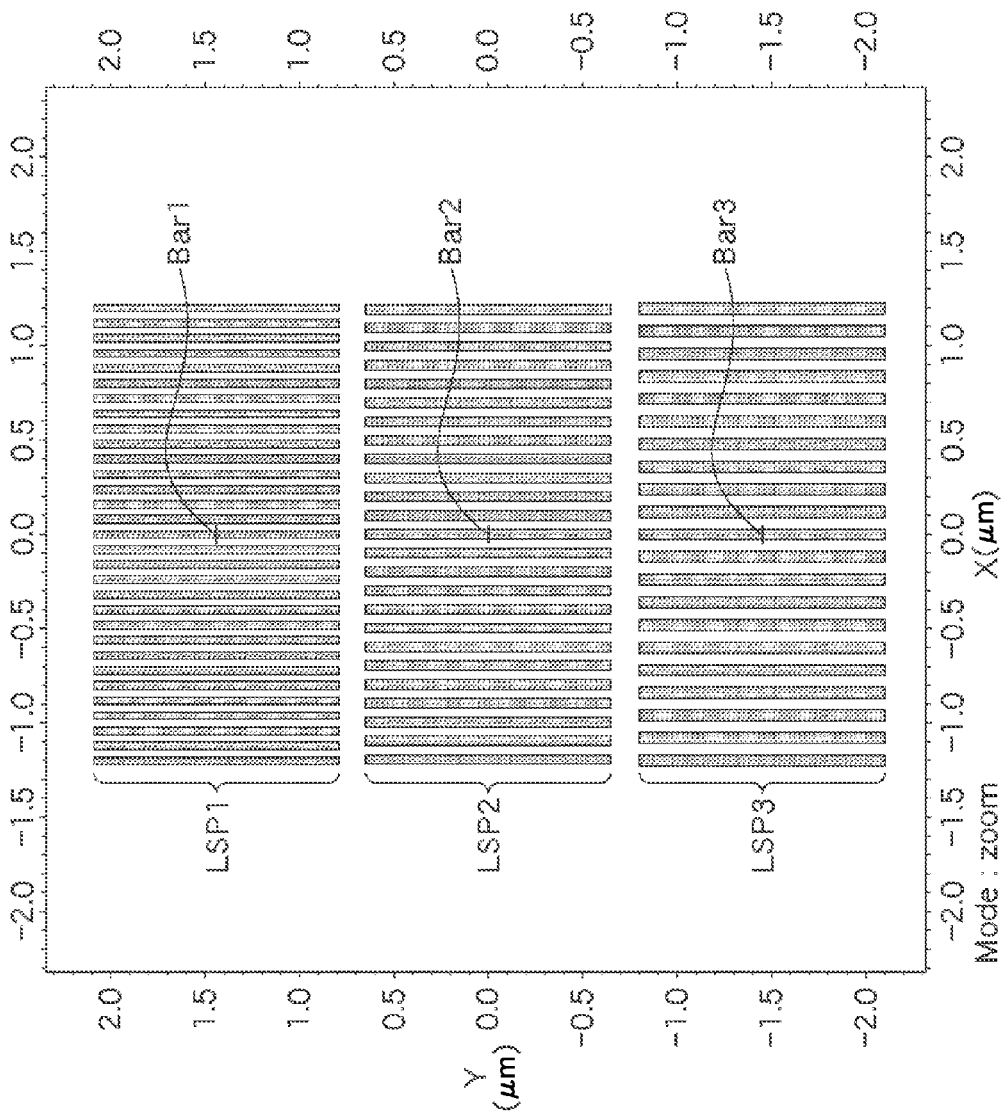
FIG. 4 is a view illustrating an example of evaluation positions set in step S108 shown in FIG. 1.

In step S108, evaluation positions (evaluation points or evaluation line segments (cut lines)) are set in the image plane of the projection optical system to evaluate optical images of the mask pattern, which are formed on the image plane of the projection optical system. In this embodiment, evaluation positions Bar1, Bar2, and Bar3 are set at the positions in the image plane of the projection optical system, which correspond to the centers of the line patterns of the line-and-space patterns LSP1, LSP2, and LSP3, respectively, as shown in FIG. 4. Referring to FIG. 4, the size on the object plane of the projection optical system is assumed to be equal to that on the image plane of the projection optical system (that is, the projection optical system is assumed to have unit magnification) for the sake of simplicity. However, in practice, evaluation positions must be set in the image plane of the projection optical system in consideration of a mask pattern having a size on the scale of the image plane based on the magnification of the projection optical system.

In step S110, an evaluation criterion is set to compare and evaluate an optical image (its image performance) of the mask pattern, which is formed at each evaluation position set in step S108, with respect to a target pattern to be formed on the substrate (the image plane of the projection optical system). The evaluation criterion set in this embodiment will be described in detail below. First, the target line widths (target values) of optical images formed at the evaluation positions Bar1, Bar2, and Bar3 are set to 40 nm, 50 nm, and 60 nm, respectively. A combination of the focus position and the amount of exposure, which allow the error of the optical image from the target line width to fall below ±10%, is commonly called a process window. In this process window, the range of the focus position (the depth of focus, that is, the margin with respect to the focal point), within which an exposure amount margin of 10% can be obtained commonly to all the evaluation positions Bar1, Bar2, and Bar3, is set as an evaluation criterion in this embodiment.

In this embodiment, an evaluation position is set at the position in the image plane of the projection optical system, which corresponds to the center of the line pattern of each line-and-space pattern, and the depth of focus at this evaluation position is set as an evaluation criterion. However, the evaluation position and the evaluation criterion are not limited to these examples. For example, an evaluation position may also be set at the position in the image plane of the projection optical system, which corresponds to the endmost line pattern of each line-and-space pattern, and the depth of focus common to the central line pattern and endmost line pattern of this line-and-space pattern may be set as an evaluation criterion. Note that the evaluation criterion is not limited to the depth of focus, and may be the difference between the dimension of the optical image of the mask pattern and that of the target pattern, the exposure margin of the optical image of the mask pattern, the contrast of the optical image of the mask pattern, or the ILS (Image Log Slope) of the optical image of the mask pattern. Also, a coordinate in the image plane of the projection optical system may be set as an evaluation position (evaluation point), and a position offset (also commonly called an "edge placement error") of the optical image from this coordinate may be set as an evaluation criterion.

In step S112, the values of the mask parameters, those of the illumination parameters, and those of the aberration parameters are optimized to determine the exposure conditions, that is, the mask pattern, the effective light source shape, and the aberration of the projection optical system. First, the values of the mask parameters, those of the illumination parameters, and those of the aberration parameters are determined so that the optical image of the mask pattern, which is formed at each evaluation position set in step S108, satisfies the evaluation criterion set in step S110. The mask pattern, the effective light source shape, and the aberration of the projection optical system, which are defined by the determined values of the mask parameters, those of the illumination parameters, and those of the aberration parameters, respectively, are determined as exposure conditions.

In this embodiment, 11 independent parameters: the mask parameters M1, M2, and M3, the illumination parameters S1, S2, and S3, and the aberration parameters C5, C6, C7, C8, and C9 are set, as described above. A parameter space which includes all these parameters is formed, and the values of these parameters are optimized in this parameter space using the downhill simplex method. More specifically, the optical images of the mask pattern are calculated while changing the value of each parameter to obtain the depth of focus (evaluation criterion) at the evaluation positions, and the value of this parameter is optimized so that the depth of focus becomes as large as possible.

Although the value of each parameter is optimized using the downhill simplex method in this embodiment, it may be optimized using an optimization method based on the simulated annealing method or mathematical programming such as linear programming. Also, although the aberration parameters C5, C6, C7, C8, and C9 are set to change independently in this embodiment, the amount of change in aberration may be expressed as a function of the image height or each aberration, in accordance with the performance of the aberration adjusting mechanism provided in the projection optical system.

The values of the respective parameters M1, M2, M3, S1, S2, S3, C5, C6, C7, C8, and C9 optimized in this embodiment are shown in Parameter Group 1.

(Parameter Group 1)
M1=40.2 (nm)
M2=57.7 (nm)
M3=72.8 (nm)
S1=0.876
S2=0.624
S3=22.3 (°)
C5=+6.8 (mλ)
C6=−21.2 (mλ)
C7=−12.4 (mλ)
C8=+17.8 (mλ)
C9=−15.1 (mλ)

Figure 5:
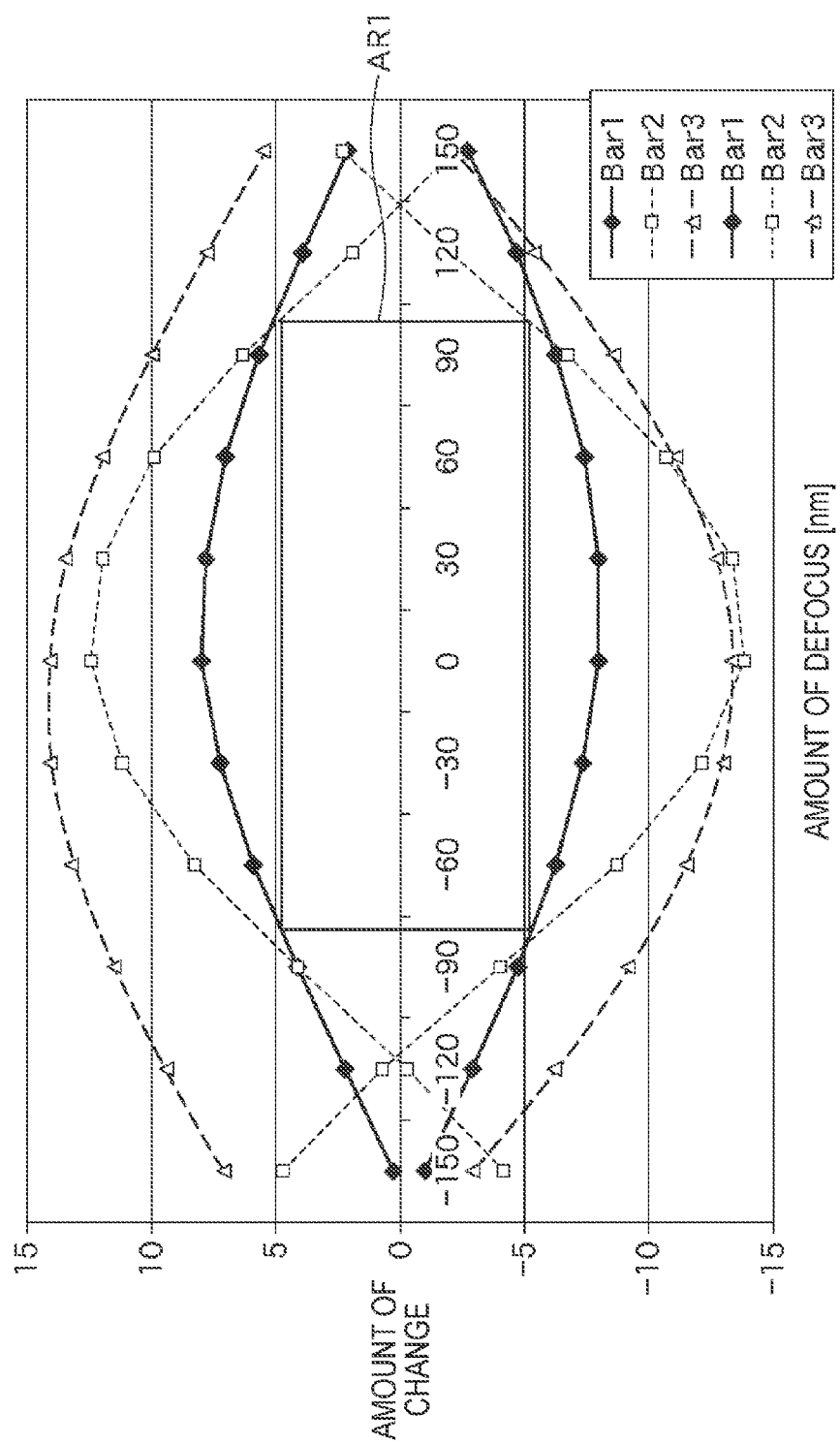
FIG. 5 is a graph showing the image performance characteristics of optical images, formed on the image plane of a projection optical system, at the evaluation positions in correspondence with the parameters optimized in the first embodiment.

FIG. 5 is a graph showing the image performance characteristics of optical images, formed on the image plane of the projection optical system, at the evaluation positions Bar1, Bar2, and Bar3 in correspondence with the parameters (Parameter Group 1) optimized in this embodiment. FIG. 5 shows the amount of defocus from a reference focus position on the abscissa, and the amount of change (%) from a reference amount of exposure on the ordinate. Also, FIG. 5 shows plots of the combinations of the focus positions and the amounts of exposure, which allow the line widths at the evaluation positions Bar1, Bar2, and Bar3 to be equal to +10% or −10% of the target line widths, and points forming each plot are connected to each other by a straight line. Therefore, a region sandwiched between two plot lines corresponding to each of the evaluation positions Bar1, Bar2, and Bar3 is the range of the exposure conditions, within which the deviation of the optical image from the target line width falls within the range of ±10%. Also, a portion common to the regions for all the evaluation positions Bar1, Bar2, and Bar3 is a process window. In this process window, the range of the focus position, within which an exposure amount margin of 10% can be commonly obtained, is the depth of focus. The depth of focus as an evaluation criterion for the image performance of the optical image of the mask pattern in this embodiment corresponds to the dimension of a region AR1 in the focus direction (the horizontal dimension of the region AR1) shown in FIG. 5. As shown in FIG. 5, the depth of focus obtained in this embodiment is 177.4 nm.

The case wherein the mask parameters M1, M2, and M3 and the illumination parameters S1, S2, and S3 are optimized without changing the values of the aberration parameters C5, C6, C7, C8, and C9 (that is, without taking into consideration the aberration of the projection optical system) will be considered herein as Comparative Example 1. More specifically, in the flowchart shown in FIG. 1, in step S106, no aberration parameters are set (no aberration values are set as variables), and values corresponding to the actual residual aberrations of the projection optical system are input to the coefficients C5 to C36, as shown in Table 2.

TABLE 2

| C 5 | C 6 | C 7 | C 8 | C 9 | C 10 | C 11 | C 12 | C 13 | C 14 | C 15 | C 16 | C 17 | C 18 | C 19 | C 20 |
|---|---|---|---|---|---|---|---|---|---|---|---|---|---|---|---|
| 20.6 | −4.4 | −10 | 1.6 | 8 | −4.4 | −7.6 | 9.2 | 2.2 | −14 | −3 | 18.4 | 9.6 | −3.2 | −1.2 | −3.4 |
| C 21 | C 22 | C 23 | C 24 | C 25 | C 26 | C 27 | C 28 | C 29 | C 30 | C 31 | C 32 | C 33 | C 34 | C 35 | C 36 |
| 7.4 | −0.6 | −7 | 2.6 | −3.6 | 4.2 | −2.4 | 0.4 | 0.2 | −3.2 | −0.4 | 1.4 | −3 | 7.6 | 0.2 | −3 |

(unit: mλ)

Note that the values of the coefficients C10 to C36 shown in Table 2 are the same as those shown in Table 1. The values of the parameters M1, M2, M3, S1, S2, and S3 optimized in Comparative Example 1 are shown in Parameter Group 2.

(Parameter Group 2)
M1=41.8 (nm)
M2=58.2 (nm)
M3=73.4 (nm)
S1=0.879
S2=0.693
S3=19.8 (°)

Figure 6:
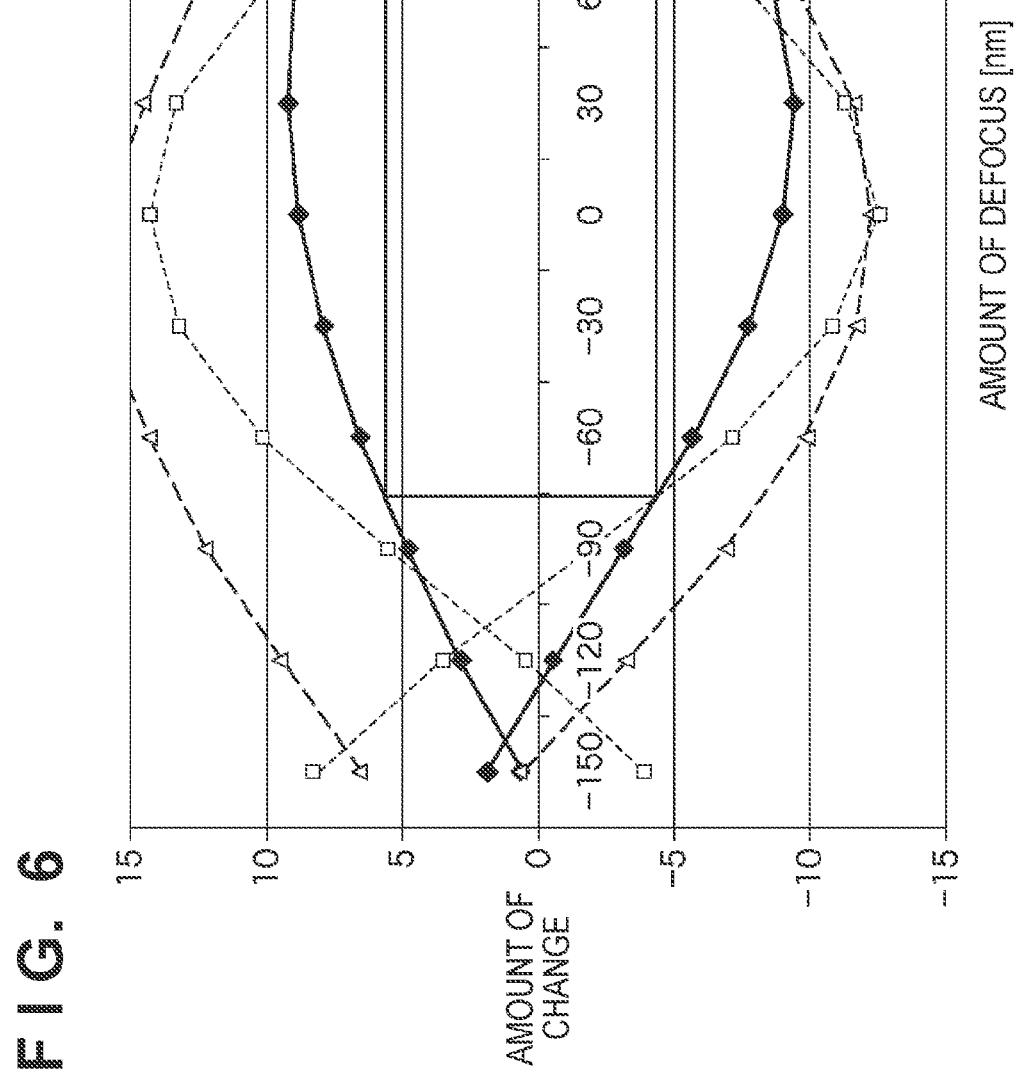
FIG. 6 is a graph showing the image performance characteristics of optical images, formed on the image plane of a projection optical system, at the evaluation positions in correspondence with the parameters optimized in Comparative Example 1.

FIG. 6 is a graph showing the image performance characteristics of optical images, formed on the image plane of the projection optical system, at the evaluation positions Bar1, Bar2, and Bar3 in correspondence with the parameters (Parameter Group 2) optimized in Comparative Example 1. FIG. 6 shows the amount of defocus from a reference focus position on the abscissa, and the amount of change (%) from a reference amount of exposure on the ordinate. Also, FIG. 6 shows plots of the combinations of the focus positions and the amounts of exposure, which allow the line widths at the evaluation positions Bar1, Bar2, and Bar3 to be equal to +10% or −10% of the target line widths, and points forming each plot are connected to each other by a straight line. Referring to FIG. 6, the depth of focus (the horizontal dimension of a region AR2 shown in FIG. 6) obtained in Comparative Example 1 is 155.1 nm.

Hence, the depth of focus obtained in this embodiment is wider by 20 nm or more than that obtained in Comparative Example 1. This means that in optimizing the exposure conditions, defining the aberration of the projection optical system as a target to be optimized as with the effective light source shape and the mask pattern is effective in improving the image performance of the optical image of the mask pattern.

Also, the case wherein the mask parameters M1, M2, and M3 and the illumination parameters S1, S2, and S3 are optimized without changing the values of the aberration parameters C5, C6, C7, C8, and C9 (that is, without taking into consideration the aberration of the projection optical system) will be considered herein as Comparative Example 2. More specifically, in the flowchart shown in FIG. 1, in step S106, no aberration parameters are set, and values shown in Table 3 are input to the coefficients C5 to C36.

in the projection optical system. The values of the parameters M1, M2, M3, S1, S2, and S3 optimized in Comparative Example 2 are shown in Parameter Group 3.

(Parameter Group 3)
M1=41.8 (nm)
M2=58.2 (nm)
M3=73.4 (nm)
S1=0.891
S2=0.628
S3=21.7 (°)

Figure 7:
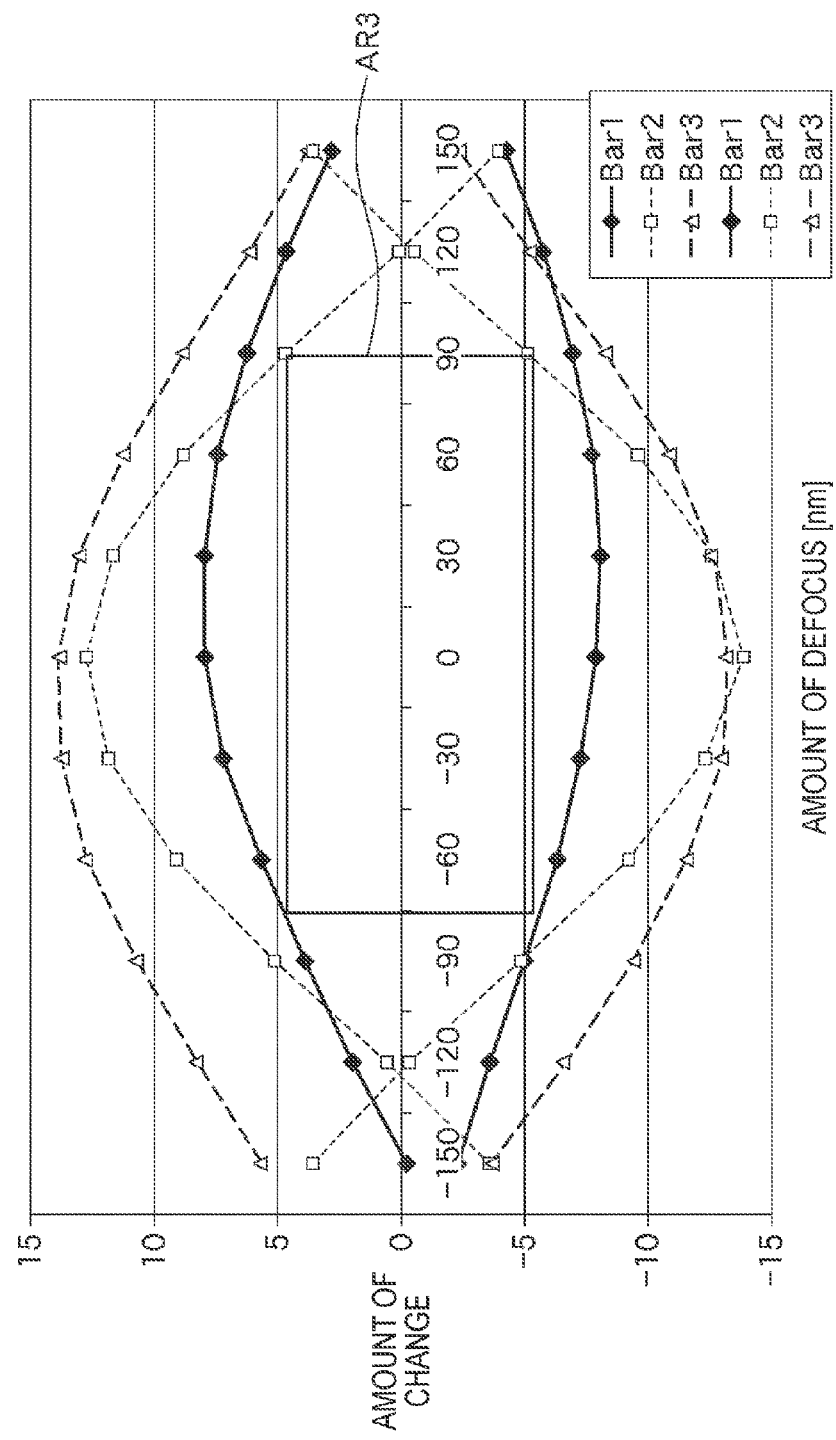
FIG. 7 is a graph showing the image performance characteristics of optical images, formed on the image plane of a projection optical system, at the evaluation positions in correspondence with the parameters optimized in Comparative Example 2.

FIG. 7 is a graph showing the image performance characteristics of optical images, formed on the image plane of the projection optical system, at the evaluation positions Bar1, Bar2, and Bar3 in correspondence with the parameters (Parameter Group 3) optimized in Comparative Example 2. FIG. 7 shows the amount of defocus from a reference focus position on the abscissa, and the amount of change (%) from a reference amount of exposure on the ordinate. Also, FIG. 7 shows plots of the combinations of the focus positions and the amounts of exposure, which allow the line widths at the evaluation positions Bar1, Bar2, and Bar3 to be equal to +10% or −10% of the target line widths, and points forming each plot are connected to each other by a straight line. Referring to FIG. 7, the depth of focus (the horizontal dimension of a region AR3 shown in FIG. 7) obtained in Comparative Example 1 is 164.6 nm.

As can be seen from comparisons between this embodiment (FIG. 5), and Comparative Example 1 (FIG. 6) and Comparative Example 2 (FIG. 7), an optical image having excellent image performance can be formed by optimizing not only the mask pattern and the effective light source shape but also the aberration of the projection optical system.

The reason why defining the aberration of the projection optical system as a target to be optimized is effective in improving the image performance of the optical image of the mask pattern will be considered. As is obvious from the foregoing description, as long as the effective light source shape and the mask pattern are determined, it is possible to specify the position in the pupil plane of the projection optical system, through which light (exposure light) passes upon illumination of this mask pattern using this effective light source shape. Especially the position in the pupil plane of the projection optical system, through which exposure

TABLE 3

| C 5 | C 6 | C 7 | C 8 | C 9 | C 10 | C 11 | C 12 | C 13 | C 14 | C 15 | C 16 | C 17 | C 18 | C 19 | C 20 |
|---|---|---|---|---|---|---|---|---|---|---|---|---|---|---|---|
| 0 | 0 | 0 | 0 | 0 | −4.4 | −7.6 | 9.2 | 2.2 | −14 | −3 | 18.4 | 9.6 | −3.2 | −1.2 | −3.4 |
| C 21 | C 22 | C 23 | C 24 | C 25 | C 26 | C 27 | C 28 | C 29 | C 30 | C 31 | C 32 | C 33 | C 34 | C 35 | C 36 |
| 7.4 | −0.6 | −7 | 2.6 | −3.6 | 4.2 | −2.4 | 0.4 | 0.2 | −3.2 | −0.4 | 1.4 | −3 | 7.6 | 0.2 | −3 |

(unit: mλ)

The values of the coefficients C10 to C36 shown in Table 3 are the same as those shown in Tables 1 and 2, while zero is input to the coefficients C5 to C9 representing low-order aberrations in Comparative Example. This is done assuming an ideal state in which low-order aberrations are perfectly suppressed by the aberration adjusting mechanism provided light passes, strongly depends on the shape and pitch of a target pattern to be formed on the substrate. The mask pattern and the effective light source shape are optimized in the related art techniques as well. However, in the related art techniques, the mask pattern and the effective light source shape are simply optimized (adjusted) for a target pattern, so it is impossible to dramatically change the position in the pupil plane of the projection optical system, through which exposure light passes.

On the other hand, the aberration of the projection optical system represents a change in phase of a light beam at each position in the pupil plane, as described above. As in the related art techniques, when a known aberration is input, and a large aberration is present at the position within the pupil plane of the projection optical system, which corresponds to the shape and pitch of a target pattern, the influence that the aberration exerts on the image performance cannot be compensated for even if the mask pattern and the effective light source shape are optimized. Therefore, to improve the image performance of the optical image of the mask pattern, it is indispensable to simultaneously optimize not only the mask pattern and the effective light source shape but also the aberration of the projection optical system.

As can be seen from, for example, FIG. 6 (Comparative Example 1), the focus position at which the exposure margin maximizes varies in the individual evaluation positions Bar1, Bar2, and Bar3. Especially the focus position at the evaluation position Bar1 considerably shifts in the positive direction. This shift represents the influence that the aberration of the projection optical system exerts on the image performance, and this means that the influence that the aberration of the projection optical system exerts on the image performance cannot be compensated for even if the mask pattern and the effective light source shape are optimized.

On the other hand, as can be seen from FIG. 5 (this embodiment), the focus position at the evaluation position Bar1 is corrected, so the best focus position in the exposure margin is nearly the same in the individual evaluation positions Bar1, Bar2, and Bar3. Hence, the use of low-order aberrations (their generation) makes it possible to compensate for the influence (for example, a shift in focus position) that high-order aberrations exert on the image performance, thereby obtaining a wider depth of focus.

Further, FIG. 7 (Comparative Example 2) reveals an effect of generating low-order aberrations. In Comparative Example 2, the mask pattern and the effective light source shape are optimized in an ideal state in which low-order aberrations are perfectly suppressed, but the depth of focus has a small value due to the influence of high-order aberrations. It is difficult for the aberration adjusting mechanism provided in the projection optical system to suppress high-order aberrations, as described above. Therefore, when high-order aberrations remain in the projection optical system, it is more effective to generate low-order aberrations so as to improve the balance between high- and low-order aberrations (that is, so as to cancel the influence of high-order aberrations) than to keep the low-order aberrations small.

As is obvious from the foregoing description, the related art techniques of optimizing the mask pattern and the effective light source shape by inputting a specific value to the aberration of the projection optical system (by using this aberration itself as a constant) are insufficient to optimize the exposure conditions. Therefore, in this embodiment, defining not only the effective light source shape and the mask pattern but also the aberration of the projection optical system as a target to be optimized makes it possible to provide a technique that is advantageous in optimizing the exposure conditions of an exposure apparatus.

<Second Embodiment>

In the first embodiment, three types of characteristics: the mask pattern, the effective light source shape, and the aberration of the projection optical system are defined as targets to be optimized. However, the mask pattern can also be excluded from the targets to be optimized. Since a mask used for an exposure apparatus is very expensive, it is desired to avoid remanufacturing a mask (manufacturing it again) after one mask is manufactured. Hence, in this embodiment, the effective light source shape and the aberration of the projection optical system are optimized without changing the mask pattern (that is, fixing the mask pattern).

Figure 8:
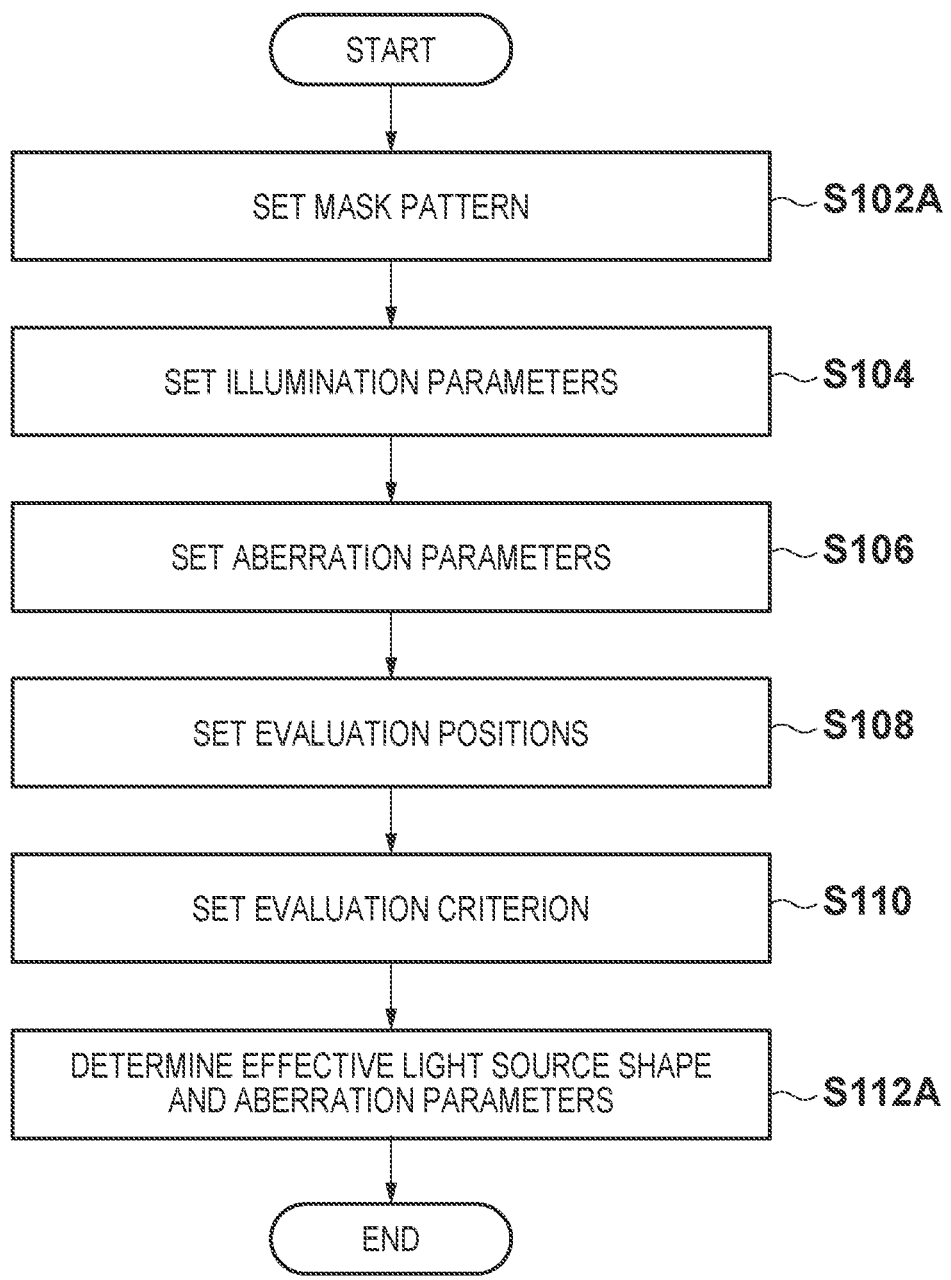
FIG. 8 is a flowchart for explaining a determination method according to the second embodiment of the present invention.

FIG. 8 is a flowchart for explaining a determination method according to the second embodiment of the present invention. The determination method in this embodiment is similar to that in the first embodiment, but has step S102A in place of step S102, and step S112A in place of step S112.

In step S102A, the pattern (mask pattern) of a mask to be placed on the object plane of the projection optical system is set. In this embodiment, a mask pattern including three types of line-and-space patterns LSP1, LSP2, and LSP3 is set, as shown in FIG. 2. Note that in this embodiment, the mask pattern remains the same, so the mask parameters M1, M2, and M3 are fixed to the following values:

M1=41 (nm)
M2=58 (nm)
M3=73 (nm)

In steps S104, S106, S108, and S110, illumination parameters S1, S2, and S3, aberration parameters C5, C6, C7, C8, and C9, evaluation positions, and an evaluation criterion, respectively, are set, as described in the first embodiment.

In this embodiment, the coefficients C5, C6, C7, C8, and C9 of the fifth to ninth terms of Zernike polynomials are set as aberration parameters. Also, zero is input to coefficients C1 to C4 of the first to fourth terms, and values shown in Table 1 are input to coefficients C10 to C36 of the 10th to 36th terms of the Zernike polynomials.

Also, in this embodiment, evaluation positions Bar1, Bar2, and Bar3 are set at the positions in the image plane of the projection optical system, which correspond to the centers of the line patterns of line-and-space patterns, and the depth of focus at these evaluation positions is set as an evaluation criterion, as shown in FIG. 4.

In step S112A, the values of the illumination parameters and those of the aberration parameters are optimized to determine the exposure conditions, that is, the effective light source shape and the aberration of the projection optical system. The values of the parameters S1, S2, S3, C5, C6, C7, C8, and C9 optimized in this embodiment are shown in Parameter Group 4.

(Parameter Group 4)
S1=0.872
S2=0.619
S3=13.4 (°)
C5=+12.5 (mλ)
C6=−6.3 (mλ)
C7=−11.3 (mλ)
C8=+18.2 (mλ)
C9=−19.9 (mλ)

Figure 9:
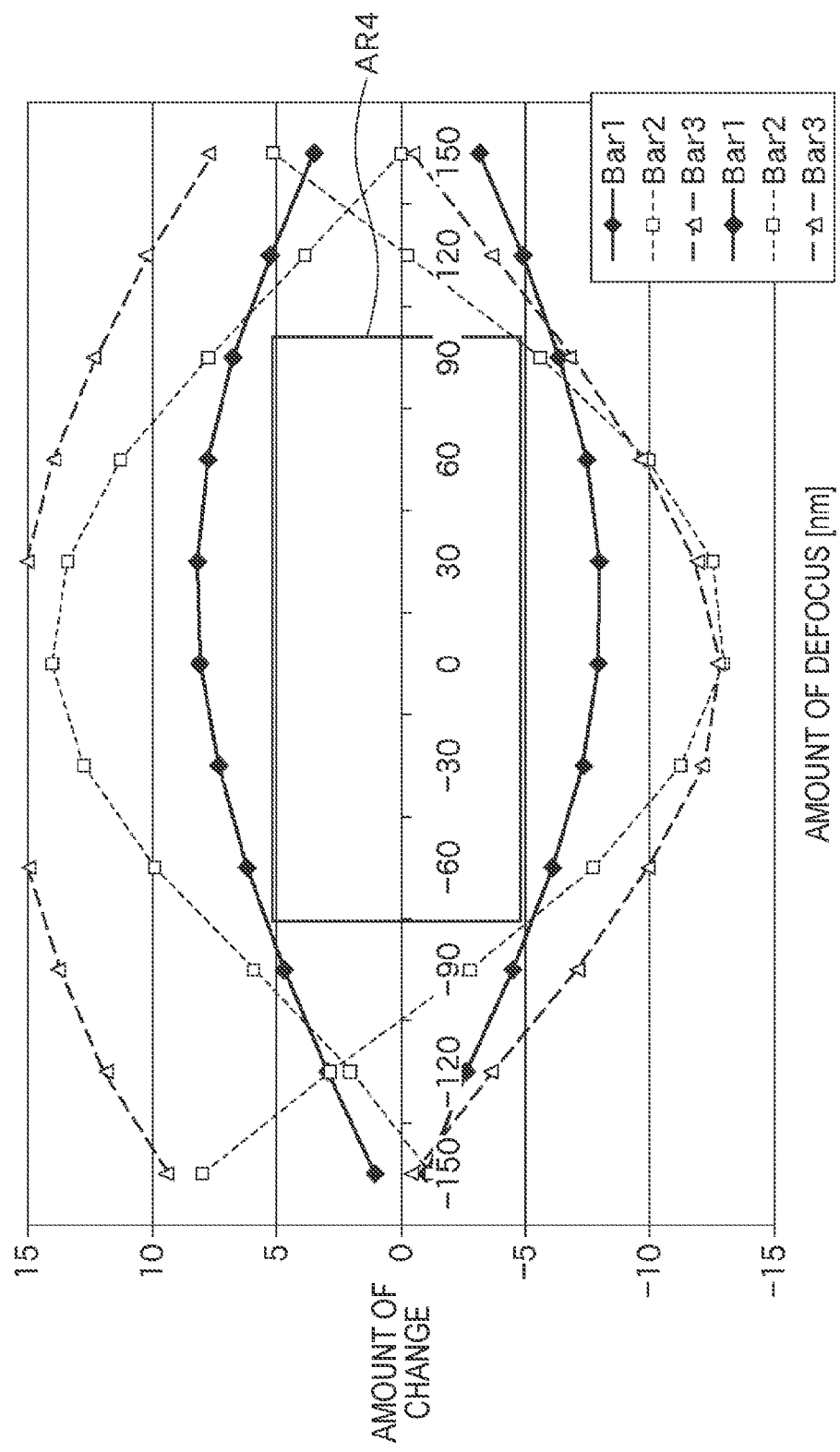
FIG. 9 is a graph showing the image performance characteristics of optical images, formed on the image plane of a projection optical system, at the evaluation positions in correspondence with the parameters optimized in the second embodiment.

FIG. 9 is a graph showing the image performance characteristics of optical images, formed on the image plane of the projection optical system, at the evaluation positions Bar1, Bar2, and Bar3 in correspondence with the parameters (Parameter Group 4) optimized in this embodiment. FIG. 9 shows the amount of defocus from a reference focus position on the abscissa, and the amount of change (%) from a reference amount of exposure on the ordinate. Also, FIG. 9 shows plots of the combinations of the focus positions and the amounts of exposure, which allow the line widths at the evaluation positions Bar1, Bar2, and Bar3 to be equal to +10% or −10% of the target line widths, and points forming each plot are connected to each other by a straight line. Referring to FIG. 9, the depth of focus (the horizontal dimension of a region AR4 shown in FIG. 9) obtained in this embodiment is 171.6 nm.

Hence, the depth of focus obtained in this embodiment is wider by 15 nm or more than that obtained in Comparative Example 1 of the first embodiment. This means that even if the mask pattern is fixed, optimizing the effective light source shape and the aberration of the projection optical system is effective in improving the image performance of the optical image of the mask pattern. In other words, as in this embodiment, even if the mask pattern is fixed at a dimension (width) that is not always optimum, defining the effective light source shape and the aberration of the projection optical system as targets to be optimized makes it possible to provide a technique advantageous in optimizing the exposure conditions of an exposure apparatus.

<Third Embodiment>

Figure 10:
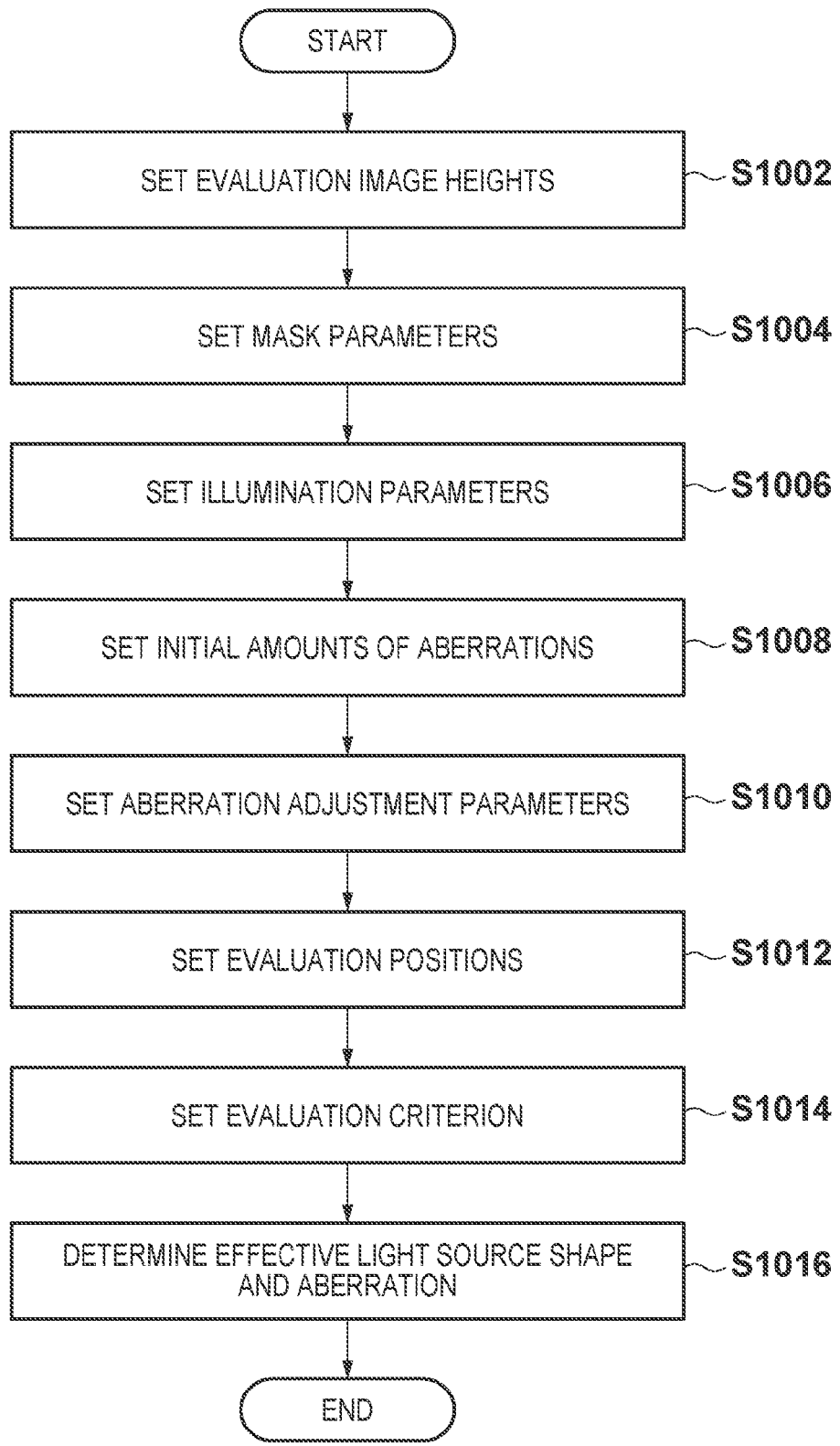
FIG. 10 is a flowchart for explaining a determination method according to the third embodiment of the present invention.

FIG. 10 is a flowchart for explaining a determination method according to the third embodiment of the present invention. The determination method of this embodiment determines (optimizes) the exposure conditions of an exposure apparatus including an illumination optical system which illuminates a mask (reticle), and a projection optical system which projects the pattern of the mask onto a substrate, as in the first and second embodiments.

In step S1002, image heights (evaluation image heights) are set to evaluate optical images of the mask pattern, which are formed on the image plane of the projection optical system. In this embodiment, assuming a step-and-scan exposure apparatus (scanner), five image heights: (−12.6, 0), (−7, 0), (0, 0), (7, 0), and (12.6, 0) are set as evaluation image heights. Note that the coordinate in the slit direction is defined as x, and that in the scan direction is defined as y.

In step S1004, parameters (mask parameters) are set for the pattern of a mask to be placed on the object plane of the projection optical system.

Figure 11:
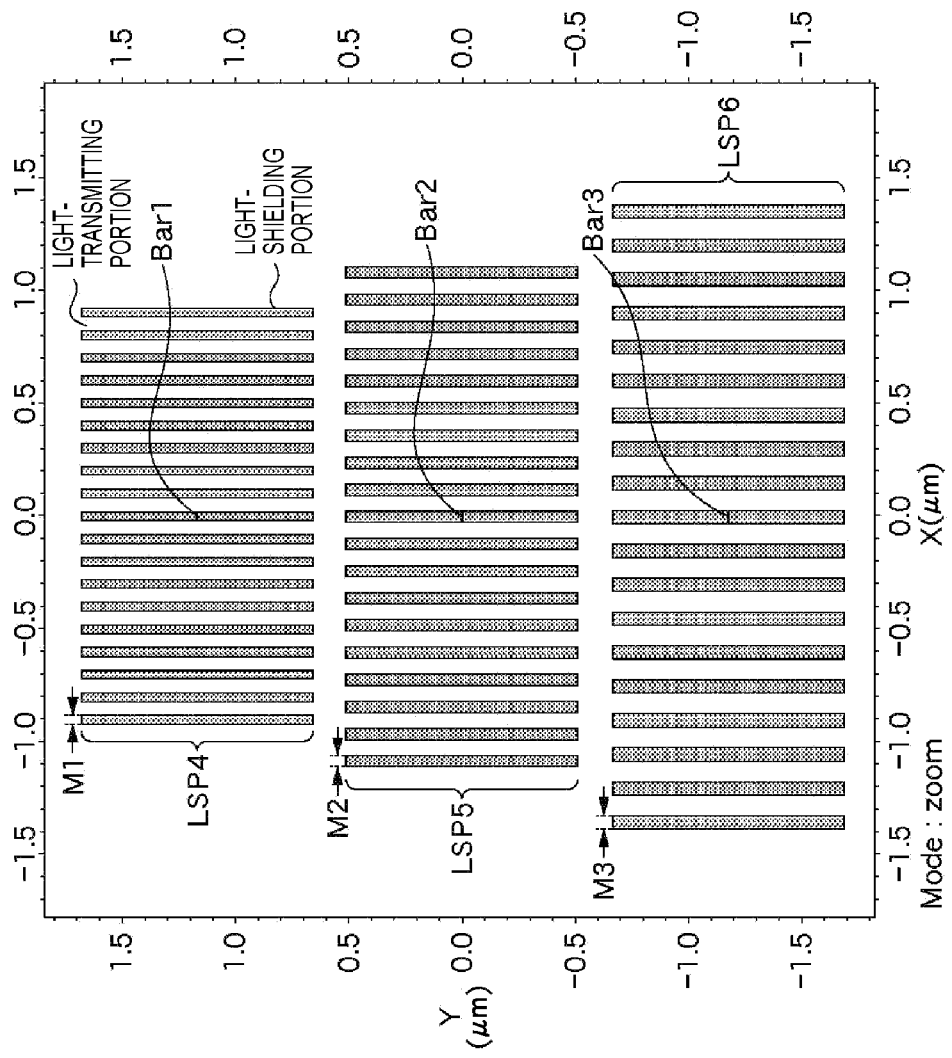
FIG. 11 is a view illustrating an example of mask parameters set in step S1002 shown in FIG. 10.

In this embodiment, mask parameters M1, M2, and M3 which define the shape of a mask pattern shown in FIG. 11 are set. The mask pattern shown in FIG. 11 includes three types of line-and-space patterns LSP4, LSP5, and LSP6 formed by light-shielding portions (transmittance: 6%) and light-transmitting portions (transmittance: 100%). The mask parameter M1 defines the dimension (width) of the line pattern of the line-and-space pattern LSP4 having a pitch of 100 nm. The mask parameter M2 defines the dimension (width) of the line pattern of the line-and-space pattern LSP5 having a pitch of 120 nm. The mask parameter M3 defines the dimension (width) of the line-and-space pattern LSP6 having a pitch of 150 nm. Note that in this embodiment, the mask pattern remains the same, so the mask parameters M1, M2, and M3 are fixed to the following values:

M1=50 (nm)
M2=53 (nm)
M3=58 (nm)

In step S1006, parameters (illumination parameters) are set for the effective light source shape. In this embodiment, as in the first and second embodiments, illumination parameters S1, S2, and S3 which define the shape of dipole illumination shown in FIG. 3 are set. Also, in this embodiment, the following upper and lower limits are defined for the illumination parameters S1, S2, and S3 as:

$0.70 \leq S1 \leq 0.98$
$0.50 \leq S2 \leq 0.85$
$20 \leq S3 \leq 110$ (°)

In step S1008, aberrations (the initial amounts of aberrations) present in the projection optical system are set. In this embodiment, the initial amounts of aberrations are represented by the coefficients C1 to C36 of the first to 36th terms of the Zernike polynomials, and values corresponding to the actual residual aberrations of the projection optical system are set for each evaluation image height set in step S1002, as shown in Table 4.

TABLE 4

| −12.6 | C4 | C5 | C6 | C7 | C8 | C9 | C10 | C11 | C12 | C13 | C14 | C15 | C16 | C17 | C18 | C19 | C20 |
|---|---|---|---|---|---|---|---|---|---|---|---|---|---|---|---|---|---|
|  | 18.2 | 24.2 | 4.2 | −10 | 2.6 | 17.4 | 0.8 | 0.4 | 6.2 | −0.8 | −15 | −0.8 | 17 | 4.4 | −1.6 | −3.4 | −0.4 |
|  | C21 | C22 | C23 | C24 | C25 | C26 | C27 | C28 | C29 | C30 | C31 | C32 | C33 | C34 | C35 | C36 |  |
|  | 3 | −2 | −3 | 0.6 | −1 | −7.8 | 3.4 | 6.6 | 2 | −3 | −4.2 | −1.2 | −2.6 | 3 | −2.8 | −6.4 |  |
| −7 | C4 | C5 | C6 | C7 | C8 | C9 | C10 | C11 | C12 | C13 | C14 | C15 | C16 | C17 | C18 | C19 | C20 |
|  | −12 | 11.4 | −3.2 | −9.4 | −2.8 | 4.6 | 4 | −1.8 | 9.6 | 0 | −14 | −0.6 | 16.6 | 6 | 0.4 | −0.2 | 1.2 |
|  | C21 | C22 | C23 | C24 | C25 | C26 | C27 | C28 | C29 | C30 | C31 | C32 | C33 | C34 | C35 | C36 |  |
|  | 1.8 | 4 | −5.6 | 1.6 | −1.2 | −3.4 | 3.2 | 2.6 | 5.8 | −1.6 | 2 | 1.8 | −2 | 1.4 | −1.4 | −8.6 |  |
| 0 | C4 | C5 | C6 | C7 | C8 | C9 | C10 | C11 | C12 | C13 | C14 | C15 | C16 | C17 | C18 | C19 | C20 |
|  | 3 | 14 | 2.8 | −4.6 | 0.6 | 18.4 | 3.4 | −5.6 | 9 | 5.6 | 4.6 | 0.8 | 13 | 6.8 | 0 | 3.8 | 1.8 |
|  | C21 | C22 | C23 | C24 | C25 | C26 | C27 | C28 | C29 | C30 | C31 | C32 | C33 | C34 | C35 | C36 |  |
|  | 2.2 | 3.2 | 1.6 | 2.8 | −1 | −0.4 | −0.4 | 2.4 | 2.2 | 1.8 | 1 | 4.8 | −2.6 | −6 | −1.2 | −6.4 |  |
| 7 | C4 | C5 | C6 | C7 | C8 | C9 | C10 | C11 | C12 | C13 | C14 | C15 | C16 | C17 | C18 | C19 | C20 |
|  | −13 | 9.2 | 6 | −5.8 | 0 | 13 | 4.8 | −3 | 18 | 12.4 | −6.8 | −0.6 | 14.2 | 6 | 3.4 | 1 | 0.8 |
|  | C21 | C22 | C23 | C24 | C25 | C26 | C27 | C28 | C29 | C30 | C31 | C32 | C33 | C34 | C35 | C36 |  |
|  | 2.6 | 4.4 | −7.6 | 2 | −1.4 | −1.4 | −0.6 | 0 | 1.8 | 1.6 | 0.6 | 1.6 | −0.4 | −0.6 | 0.8 | −9.2 |  |
| 12.6 | C4 | C5 | C6 | C7 | C8 | C9 | C10 | C11 | C12 | C13 | C14 | C15 | C16 | C17 | C18 | C19 | C20 |
|  | 18.2 | 8.4 | −0.8 | −2 | −2.4 | 22.6 | −4 | −7.8 | 6.4 | 10.8 | −3 | −5 | 10.4 | −7.4 | −2.4 | 4.6 | −3.4 |
|  | C21 | C22 | C23 | C24 | C25 | C26 | C27 | C28 | C29 | C30 | C31 | C32 | C33 | C34 | C35 | C36 |  |
|  | 0.8 | 1.6 | −4.8 | 1 | 1.6 | 2.4 | −3 | −1 | 0.2 | −1.6 | −6.6 | 2.6 | −1.6 | 5.8 | −2 | −7.4 |  |

(unit: mλ)

In step S1010, parameters (aberration adjustment parameters) representing the amounts of aberrations to be adjusted from the initial amounts of aberrations are set as parameters (aberration parameters) for the aberration of the projection optical system. In this embodiment, an image height coma aberration adjustment parameter P1 for image height coma aberration, a spherical aberration adjustment parameter P2 for spherical aberration, and a field curvature aberration adjustment parameter P3 for field curvature aberration are set as aberration adjustment parameters. The amounts of aberrations corresponding to the values of these aberration adjustment parameters can be generated by moving an optical element which forms the projection optical system in the optical axis direction. Therefore, the aberration adjustment parameters also represent the amount of movement (amount of driving) of the optical element which forms the projection optical system in the optical axis direction.

Also, each of amounts of generated aberrations ΔC7 and ΔC9 and an image plane width ΔZdef is expressed as a function of a distance h (mm) (image height) from the optical axis of the projection optical system, as shown in Table 5.

TABLE 5

|  | P1 (μm) | P2 (μm) | P3 (μm) |
|---|---|---|---|
| ΔC7 (mλ) | 1 × (h/13) | −0.003 × (h/13) | −0.018 × (h/13)$^3$ +0.011 × (h/13) |
| ΔC9 (mλ) | 0.019 × (h/13)$^2$ | 1 | −0.005 × (h/13)$^2$ |
| ΔZdef (nm) | 0 | 0 | 1 × (h/13)$^2$ |

When the aberration adjustment parameters P1, P2, and P3 are set, the amount of aberration adjustment at each image height can be obtained.

In this embodiment, the aberration adjustment parameters represent the amount of movement of an optical element which forms the projection optical system in the optical axis direction. However, the aberration adjustment parameters may represent, for example, the eccentricity and tilt of the optical element which forms the projection optical system, the amount of movement of a stage, or the amount of driving of the optical element which forms the illumination optical system.

Also, the aberration adjusting parameters have values which vary in each individual exposure apparatus. Therefore, it is preferable to create databases of parameter sensitivity tables for the respective exposure apparatus so that they can be selected and applied to a variety of exposure apparatuses.

Note that in this embodiment, the following adjustment ranges of the amounts of aberrations are defined for the aberration adjustment parameters P1, P2, and P3 as:

−50≤P1≤50 (μm)
−50≤P2≤50 (μm)
−50≤P3≤50 (μm)

In step S1012, evaluation positions are set in the image plane of the projection optical system to evaluate optical images of the mask pattern, which are formed on the image plane of the projection optical system. In this embodiment, evaluation positions Bar1, Bar2, and Bar3 are set at the positions in the image plane of the projection optical system, which correspond to the centers of the line patterns of the line-and-space patterns LSP4, LSP5, and LSP6, respectively, as shown in FIG. 11.

In step S1014, an evaluation criterion is set to compare and evaluate an optical image (its image performance) of the mask pattern, which is formed at each evaluation position set in step S1012, with respect to a target pattern to be formed on the substrate (the image plane of the projection optical system). The evaluation criterion set in this embodiment will be described in detail below. First, all the target line widths (target values) of optical images formed at the evaluation positions Bar1, Bar2, and Bar3 are set to 50 nm. In this embodiment, the RMS of the difference (CD difference) between the dimension of the optical image of the mask pattern and that of the target pattern is set as an evaluation criterion. Note that the CD differences are obtained while changing the amount of defocus to 0, ±20 nm, and ±40 nm for each of five image heights: (−12.6, 0), (−7, 0), (0, 0), (7, 0), and (12.6, 0).

In this embodiment, an evaluation position is set at the position in the image plane of the projection optical system, which corresponds to the center of the line pattern of each line-and-space pattern, and the CD difference at this evaluation position is set as an evaluation criterion. However, the evaluation position and the evaluation criterion are not limited to these examples. For example, an evaluation position may also be set at the position in the image plane of the projection optical system, which corresponds to the endmost line pattern of each line-and-space pattern, and the CD difference common to the central line pattern and endmost line pattern of this line-and-space pattern may be set as an evaluation criterion. Also, a pattern which varies in each individual image height may be set, and the CD difference of this pattern from the target line width may be set as an evaluation criterion. Note that the evaluation criterion is not limited to the CD difference, and may be the depth of focus, the exposure margin of the optical image of the mask pattern, the contrast of the optical image of the mask pattern, or the ILS (Image Log Slope) of the optical image of the mask pattern. Also, a coordinate in the image plane of the projection optical system may be set as an evaluation position (evaluation point), and a position offset (also commonly called an "edge placement error") of the optical image from this coordinate may be set as an evaluation criterion.

In step S1016, the values of the illumination parameters and those of the aberration adjustment parameters are optimized to determine the exposure conditions, that is, the effective light source shape and the aberration of the projection optical system. First, the values of the illumination parameters and those of the aberration adjustment parameters are determined so that the optical image of the mask pattern, which is formed at each evaluation position set in step S1012, satisfies the evaluation criterion set in step S1014. The effective light source shape and the aberration of the projection optical system (the amounts of aberrations to be adjusted from the initial amounts of aberrations), which are defined by the determined values of the illumination parameters and those of the aberration adjustment parameters, respectively, are determined as exposure conditions.

In this embodiment, independent six parameters: the illumination parameters S1, S2, and S3 and the aberration adjustment parameters P1, P2, and P3 are set, as described above. A parameter space which includes all these parameters is formed, and the values of these parameters are optimized in this parameter space using the downhill simplex method. More specifically, the optical images of the mask pattern are calculated while changing the value of each parameter to obtain the RMS of the CD difference (evaluation criterion) at the evaluation positions, and the value of this parameter is optimized so that the RMS of the CD difference becomes as small as possible.

The values of the parameters S1, S2, S3, P1, P2, and P3 before optimization in this embodiment are shown in Parameter Group 5.

(Parameter Group 5)
S1=0.950
S2=0.713
S3=45 (°)
P1=0
P2=0
P3=0

FIGS. 12A and 12B are graphs each showing the image performance characteristics of optical images, formed on the image plane of the projection optical system, at the evaluation positions Bar1, Bar2, and Bar3 in correspondence with the parameters (Parameter Group 5) before optimization in this embodiment. FIG. 12A shows the amount of defocus from a reference focus position on the abscissa, and the line width of each optical image on the ordinate. FIG. 12A shows plots of the line widths at the evaluation positions Bar1, Bar2, and Bar3, and points forming each plot are connected to each other by a straight line. Also, FIG. 12B shows the amount of defocus from a reference focus position on the abscissa, and the CD difference on the ordinate. FIG. 12B shows plots of the CD differences at the evaluation positions Bar1, Bar2, and Bar3, and points forming each plot are connected to each other by a straight line. Referring to FIGS. 12A and 12B, the RMSs of the CD differences for defocus amounts of 0, ±20 nm, and ±40 nm are all 7.1 nm.

The values of the parameters S1, S2, S3, P1, P2, and P3 optimized in this embodiment are shown in Parameter Group 6.

(Parameter Group 6)
S1=0.910
S2=0.663
S3=45 (°)
P1=−15.6
P2=−16.6
P3=9.3

Also, the aberrations set for each image height are shown in Table 6.

images of the mask pattern for all the image heights and all the amounts of defocus are closer to the target line widths after the values of the parameters S1, S2, S3, P1, P2, and P3 are optimized than before they are optimized.

The case wherein the illumination parameters S1, S2, and S3 are optimized without changing the values of the aberration adjustment parameters P1, P2, and P3 (that is, without taking into consideration the aberration of the projection optical system) will be considered herein as Comparative Example 3. More specifically, in the flowchart shown in FIG. 10, in step S1010, no aberration adjustment parameters are set (that is, the values of the aberration adjustment parameters P1, P2, and P3 are fixed to zero). The values of the illumination parameters S1, S2, and S3 optimized in Comparative Example 3 are shown in Parameter Group 7.

(Parameter Group 7)
S1=0.958
S2=0.694
S3=73 (°)
P1=0
P2=0
P3=0

Figure 14A:
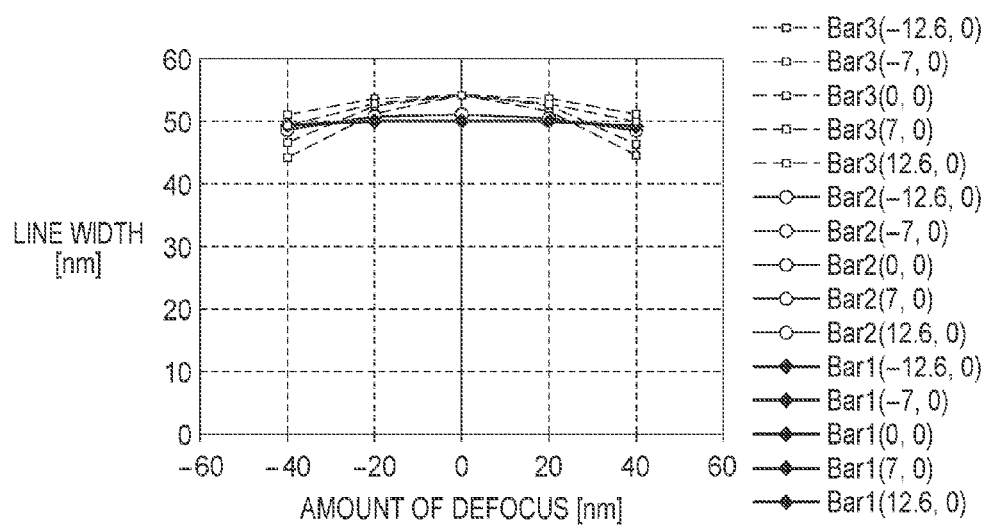
FIGS. 14A and 14B are graphs each showing the image performance characteristics of optical images, formed on the image plane of a projection optical system, at the evaluation positions in correspondence with the parameters optimized in Comparative Example 3.
Figure 14B:
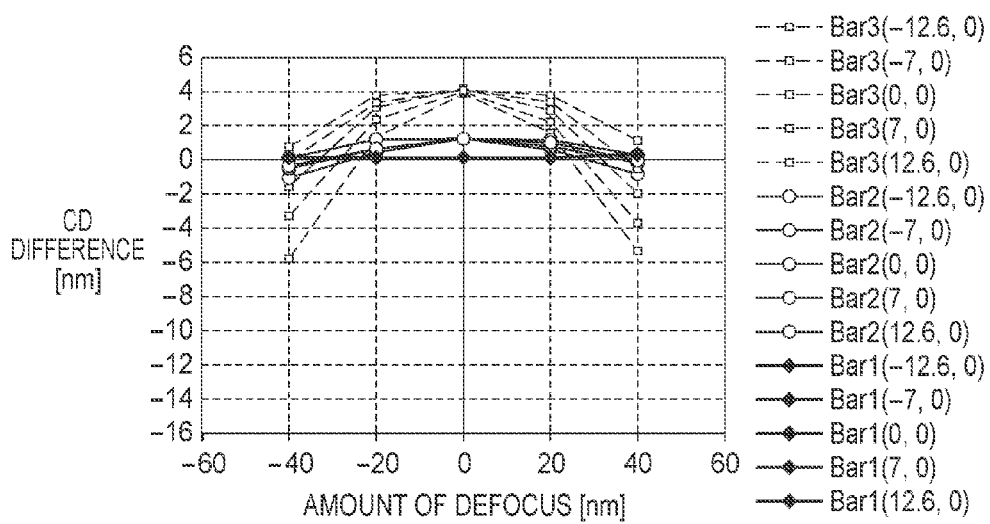

FIGS. 14A and 14B are graphs each showing the image performance characteristics of optical images, formed on the image plane of the projection optical system, at the evaluation positions Bar1, Bar2, and Bar3 in correspondence with

TABLE 6

| | C4 | C5 | C6 | C7 | C8 | C9 | C10 | C11 | C12 | C13 | C14 | C15 | C16 | C17 | C18 | C19 | C20 | zdef |
|---|---|---|---|---|---|---|---|---|---|---|---|---|---|---|---|---|---|---|
| −12.6 | 18.2 | 24.2 | 4.2 | 4.9 | 2.6 | 0.8 | 0.8 | 0.4 | 6.2 | −0.8 | −15.2 | −0.8 | 17.0 | 4.4 | −1.6 | −3.4 | −0.4 | 8.7 |
| | C21 | C22 | C23 | C24 | C25 | C26 | C27 | C28 | C29 | C30 | C31 | C32 | C33 | C34 | C35 | C36 | | |
| | 3.0 | −2.0 | −3.0 | 0.6 | −1.0 | −7.8 | 3.4 | 6.6 | 2.0 | −3.0 | −4.2 | −1.2 | −2.6 | 3.0 | −2.8 | −6.4 | | |
| −7 | C4 | C5 | C6 | C7 | C8 | C9 | C10 | C11 | C12 | C13 | C14 | C15 | C16 | C17 | C18 | C19 | C20 | zdef |
| | −11.8 | 11.4 | −3.2 | −1.0 | −2.8 | −12.0 | 4.0 | −1.8 | 9.6 | 0.0 | −13.8 | −0.6 | 16.6 | 6.0 | 0.4 | −0.2 | 1.2 | 2.7 |
| | C21 | C22 | C23 | C24 | C25 | C26 | C27 | C28 | C29 | C30 | C31 | C32 | C33 | C34 | C35 | C36 | | |
| | 1.8 | 4.0 | −5.6 | 1.6 | −1.2 | −3.4 | 3.2 | 2.6 | 5.8 | −1.6 | 2.0 | 1.8 | −2.0 | 1.4 | −1.4 | −8.6 | | |
| 0 | C4 | C5 | C6 | C7 | C8 | C9 | C10 | C11 | C12 | C13 | C14 | C15 | C16 | C17 | C18 | C19 | C20 | zdef |
| | 3.0 | 14.0 | 2.8 | −4.6 | 0.6 | 1.8 | 3.4 | −5.6 | 9.0 | 5.6 | 4.6 | 0.8 | 13.0 | 6.8 | 0.0 | 3.8 | 1.8 | 0.0 |
| | C21 | C22 | C23 | C24 | C25 | C26 | C27 | C28 | C29 | C30 | C31 | C32 | C33 | C34 | C35 | C36 | | |
| | 2.2 | 3.2 | 1.6 | 2.8 | −1.0 | −0.4 | −0.4 | 2.4 | 2.2 | 1.8 | 1.0 | 4.8 | −2.6 | −6.0 | −1.2 | −6.4 | | |
| 7 | C4 | C5 | C6 | C7 | C8 | C9 | C10 | C11 | C12 | C13 | C14 | C15 | C16 | C17 | C18 | C19 | C20 | zdef |
| | −13.4 | 9.2 | 6.0 | −14.2 | 0.0 | −3.6 | 4.8 | −3.0 | 18.0 | 12.4 | −6.8 | −0.6 | 14.2 | 6.0 | 3.4 | 1.0 | 0.8 | 2.7 |
| | C21 | C22 | C23 | C24 | C25 | C26 | C27 | C28 | C29 | C30 | C31 | C32 | C33 | C34 | C35 | C36 | | |
| | 2.6 | 4.4 | −7.6 | 2.0 | −1.4 | −1.4 | −0.6 | 0.0 | 1.8 | 1.6 | 0.6 | 1.6 | −0.4 | −0.6 | 0.8 | −9.2 | | |
| 12.6 | C4 | C5 | C6 | C7 | C8 | C9 | C10 | C11 | C12 | C13 | C14 | C15 | C16 | C17 | C18 | C19 | C20 | zdef |
| | 18.2 | 8.4 | −0.8 | −17.1 | −2.4 | 6.0 | −4.0 | −7.8 | 6.4 | 10.8 | −3.0 | −5.0 | 10.4 | −7.4 | −2.4 | 4.6 | −3.4 | 8.7 |
| | C21 | C22 | C23 | C24 | C25 | C26 | C27 | C28 | C29 | C30 | C31 | C32 | C33 | C34 | C35 | C36 | | |
| | 0.8 | 1.6 | −4.8 | 1.0 | 1.6 | 2.4 | −3.0 | −1.0 | 0.2 | −1.6 | −6.6 | 2.6 | −1.6 | 5.8 | −2.0 | −7.4 | | |

(unit: mλ)

Figure 13A:
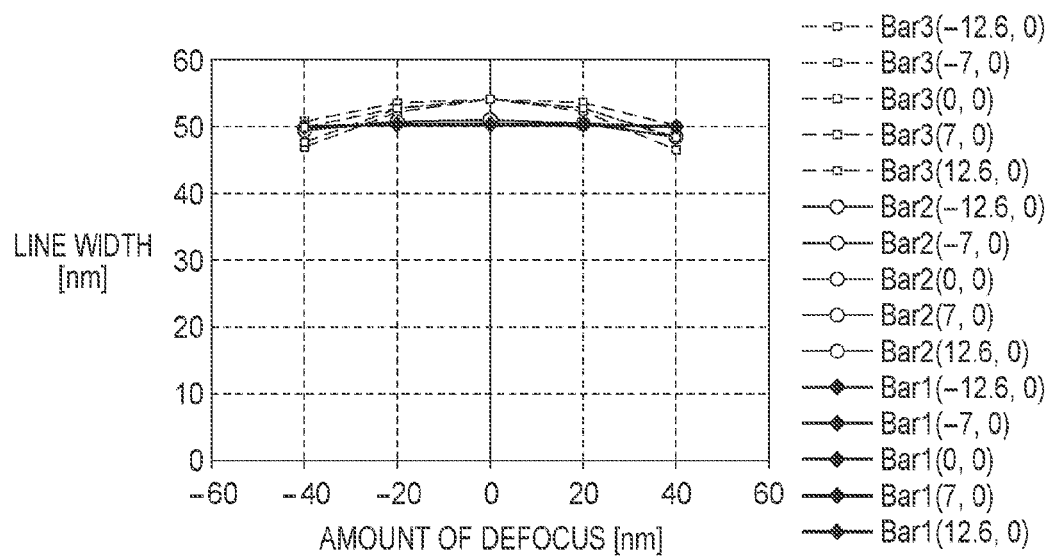
FIGS. 13A and 13B are graphs each showing the image performance characteristics of optical images, formed on the image plane of a projection optical system, at the evaluation positions in correspondence with the parameters optimized in the third embodiment.
Figure 13B:
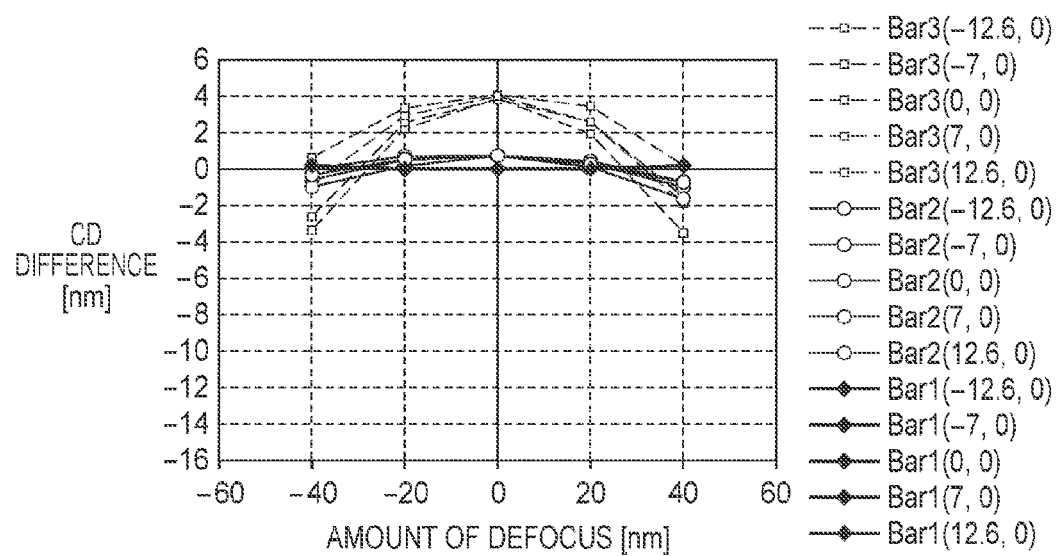

FIGS. 13A and 13B are graphs each showing the image performance characteristics of optical images, formed on the image plane of the projection optical system, at the evaluation positions Bar1, Bar2, and Bar3 in correspondence with the parameters (Parameter Group 6) optimized in this embodiment. FIG. 13A shows the amount of defocus from a reference focus position on the abscissa, and the line width of each optical image on the ordinate. FIG. 13A shows plots of the line widths at the evaluation positions Bar1, Bar2, and Bar3, and points forming each plot are connected to each other by a straight line. Also, FIG. 13B shows the amount of defocus from a reference focus position on the abscissa, and the CD difference on the ordinate. FIG. 13B shows plots of the CD differences at the evaluation positions Bar1, Bar2, and Bar3, and points forming each plot are connected to each other by a straight line. Referring to FIGS. 13A and 13B, the RMSs of the CD differences for defocus amounts of 0, ±20 nm, and ±40 nm are all 1.5 nm. As can be seen from FIGS. 13A and 13B, the line widths of the optical the parameters (Parameter Group 7) optimized in Comparative Example 3. FIG. 14A shows the amount of defocus from a reference focus position on the abscissa, and the line width of each optical image on the ordinate. FIG. 14A shows plots of the line widths at the evaluation positions Bar1, Bar2, and Bar3, and points forming each plot are connected to each other by a straight line. Also, FIG. 14B shows the amount of defocus from a reference focus position on the abscissa, and the CD difference on the ordinate. FIG. 14B shows plots of the CD differences at the evaluation positions Bar1, Bar2, and Bar3, and points forming each plot are connected to each other by a straight line. Referring to FIGS. 14A and 14B, the RMSs of the CD differences for defocus amounts of 0, ±20 nm, and ±40 nm are all 1.66 nm. This reveals that the variation among the image heights is larger in Comparative Example 3 (FIG. 14B) than in this embodiment (FIG. 13B).

Hence, in optimizing the exposure conditions, defining the aberration of the projection optical system (the amounts of aberrations to be adjusted from the initial amounts of aberrations) as a target to be optimized as with the effective light source shape and the mask pattern is effective in improving the image performance of the optical image of the mask pattern.

Also, the case wherein the aberration adjustment parameters P1, P2, and P3 are optimized without changing the values of the illumination parameters S1, S2, and S3 (that is, while the effective light source is fixed) will be considered herein as Comparative Example 4. More specifically, in the flowchart shown in FIG. 10, in step S1006, no illumination parameters are set (that is, the values of the illumination parameters S1, S2, and S3 are fixed to 0.950, 0.75, and 73, respectively). The values of the aberration adjustment parameters P1, P2, and P3 optimized in Comparative Example 4 are shown in Parameter Group 8.

(Parameter Group 8)
S1=0.950
S2=0.713
S3=73 (°)
P1=0
P2=0
P3=0

Also, the aberrations set for each image height are shown in Table 7.

Hence, the related art techniques in which known aberrations are input to optimize the effective light source shape cannot improve the image performance of the optical image of the mask pattern, compared to this embodiment in which both the effective light source shape and the aberration of the projection optical system are optimized simultaneously. However, when only the aberration of the projection optical system (the values of the aberration adjustment parameters) is optimized (Comparative Example 4), the CD difference is relatively large for a change in amount of defocus. As can be seen from comparisons between this embodiment (FIGS. 13A and 13B), and Comparative Example 3 (FIGS. 14A and 14B) and Comparative Example 4 (FIGS. 15A and 15B), an optical image having excellent image performance can be formed by optimizing both the effective light source shape and the aberration of the projection optical system simultaneously.

Also, in this embodiment, instead of using parameters representing the amounts of aberrations to be set in the projection optical system, aberration adjustment parameters representing the amounts of aberrations (the amount of driving of an optical element which forms the projection optical system) to be adjusted from the initial amounts of aberrations set in the projection optical system are used as aberration parameters. This makes it possible to use the

TABLE 7

| | C4 | C5 | C6 | C7 | C8 | C9 | C10 | C11 | C12 | C13 | C14 | C15 | C16 | C17 | C18 | C19 | C20 | zdef |
|---|---|---|---|---|---|---|---|---|---|---|---|---|---|---|---|---|---|---|
| −12.6 | 18.2 | 24.2 | 4.2 | −25.6 | 2.6 | 0.0 | 0.8 | 0.4 | 6.2 | −0.8 | −15.2 | −0.8 | 17.0 | 4.4 | −1.6 | −3.4 | −0.4 | 10.0 |
| | C21 | C22 | C23 | C24 | C25 | C26 | C27 | C28 | C29 | C30 | C31 | C32 | C33 | C34 | C35 | C36 | | |
| | 3.0 | −2.0 | −3.0 | 0.6 | −1.0 | −7.8 | 3.4 | 6.6 | 2.0 | −3.0 | −4.2 | −1.2 | −2.6 | 3.0 | −2.8 | −6.4 | | |
| −7.0 | C4 | C5 | C6 | C7 | C8 | C9 | C10 | C11 | C12 | C13 | C14 | C15 | C16 | C17 | C18 | C19 | C20 | zdef |
| | −11.8 | 11.4 | −3.2 | −17.9 | −2.8 | −12.8 | 4.0 | −1.8 | 9.6 | 0.0 | −13.8 | −0.6 | 16.6 | 6.0 | 0.4 | −0.2 | 1.2 | 3.1 |
| | C21 | C22 | C23 | C24 | C25 | C26 | C27 | C28 | C29 | C30 | C31 | C32 | C33 | C34 | C35 | C36 | | |
| | 1.8 | 4.0 | −5.6 | 1.6 | −1.2 | −3.4 | 3.2 | 2.6 | 5.8 | −1.6 | 2.0 | 1.8 | −2.0 | 1.4 | −1.4 | −8.6 | | |
| 0.0 | C4 | C5 | C6 | C7 | C8 | C9 | C10 | C11 | C12 | C13 | C14 | C15 | C16 | C17 | C18 | C19 | C20 | zdef |
| | 3.0 | 14.0 | 2.8 | −4.6 | 0.6 | 1.0 | 3.4 | −5.6 | 9.0 | 5.6 | 4.6 | 0.8 | 13.0 | 6.8 | 0.0 | 3.8 | 1.8 | 0.0 |
| | C21 | C22 | C23 | C24 | C25 | C26 | C27 | C28 | C29 | C30 | C31 | C32 | C33 | C34 | C35 | C36 | | |
| | 2.2 | 3.2 | 1.6 | 2.8 | −1.0 | −0.4 | −0.4 | 2.4 | 2.2 | 1.8 | 1.0 | 4.8 | −2.6 | −6.0 | −1.2 | −6.4 | | |
| 7.0 | C4 | C5 | C6 | C7 | C8 | C9 | C10 | C11 | C12 | C13 | C14 | C15 | C16 | C17 | C18 | C19 | C20 | zdef |
| | −13.4 | 9.2 | 6.0 | 2.7 | 0.0 | −4.4 | 4.8 | −3.0 | 18.0 | 12.4 | −6.8 | −0.6 | 14.2 | 6.0 | 3.4 | 1.0 | 0.8 | 3.1 |
| | C21 | C22 | C23 | C24 | C25 | C26 | C27 | C28 | C29 | C30 | C31 | C32 | C33 | C34 | C35 | C36 | | |
| | 2.6 | 4.4 | −7.6 | 2.0 | −1.4 | −1.4 | −0.6 | 0.0 | 1.8 | 1.6 | 0.6 | 1.6 | −0.4 | −0.6 | 0.8 | −9.2 | | |
| 12.6 | C4 | C5 | C6 | C7 | C8 | C9 | C10 | C11 | C12 | C13 | C14 | C15 | C16 | C17 | C18 | C19 | C20 | zdef |
| | 18.2 | 8.4 | −0.8 | 13.4 | −2.4 | 5.2 | −4.0 | −7.8 | 6.4 | 10.8 | −3.0 | −5.0 | 10.4 | −7.4 | −2.4 | 4.6 | −3.4 | 10.0 |
| | C21 | C22 | C23 | C24 | C25 | C26 | C27 | C28 | C29 | C30 | C31 | C32 | C33 | C34 | C35 | C36 | | |
| | 0.8 | 1.6 | −4.8 | 1.0 | 1.6 | 2.4 | −3.0 | −1.0 | 0.2 | −1.6 | −6.6 | 2.6 | −1.6 | 5.8 | −2.0 | −7.4 | | |

(unit: mλ)

Figure 15A:
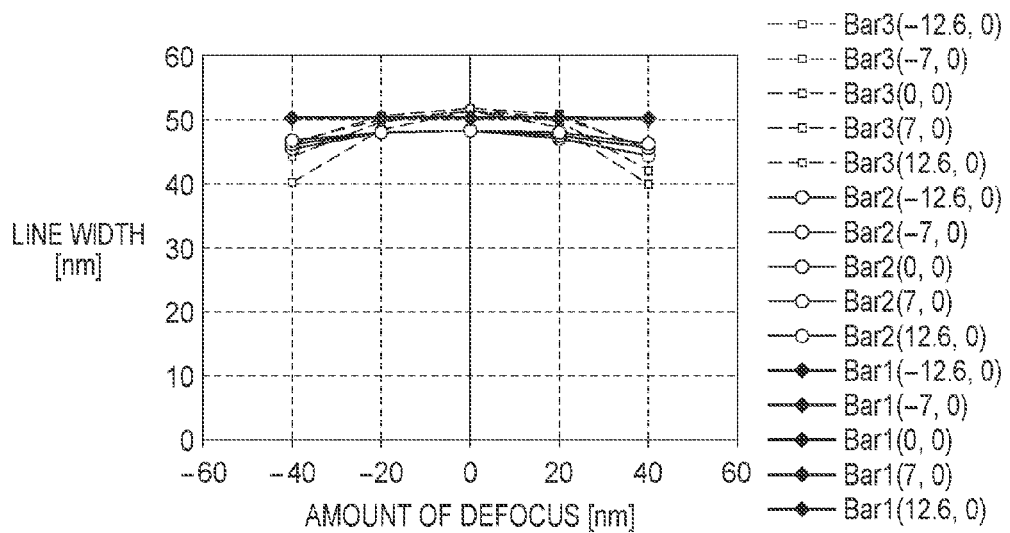
FIGS. 15A and 15B are graphs each showing the image performance characteristics of optical images, formed on the image plane of a projection optical system, at the evaluation positions in correspondence with the parameters optimized in Comparative Example 4.
Figure 15B:
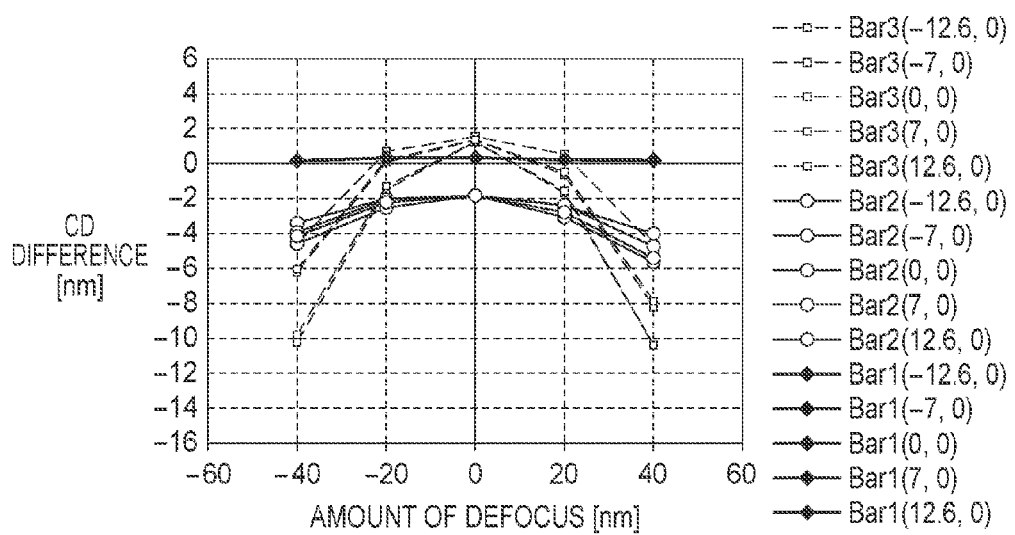

FIGS. 15A and 15B are graphs each showing the image performance characteristics of optical images, formed on the image plane of the projection optical system, at the evaluation positions Bar1, Bar2, and Bar3 in correspondence with the parameters (Parameter Group 8) optimized in Comparative Example 4. FIG. 15A shows the amount of defocus from a reference focus position on the abscissa, and the line width of each optical image on the ordinate. FIG. 15A shows plots of the line widths at the evaluation positions Bar1, Bar2, and Bar3, and points forming each plot are connected to each other by a straight line. Also, FIG. 15B shows the amount of defocus from a reference focus position on the abscissa, and the CD difference on the ordinate. FIG. 15B shows plots of the CD differences at the evaluation positions Bar1, Bar2, and Bar3, and points forming each plot are connected to each other by a straight line. Referring to FIGS. 15A and 15B, the RMSs of the CD differences for defocus amounts of 0, ±20 nm, and ±40 nm are all 3.2 nm. This reveals that the CD difference among the image heights is kept smaller in Comparative Example 4 (FIG. 14B) than before optimization in this embodiment (FIG. 12B).

optimized aberration adjustment parameters P1, P2, and P3 as commands (commands to adjust aberrations) to be input to the aberration adjusting mechanism provided in the projection optical system.

Although the effective light source shape and the aberration of the projection optical system are defined as targets to be optimized in this embodiment, the mask pattern (mask parameters M1, M2, and M3) can also be defined as a target to be optimized.

Note that the first, second, and third embodiments can also be practiced by executing the following processing. That is, software (program) for implementing the functions of the above-mentioned embodiments is supplied to a system or an apparatus via a network or various storage media, and read out and executed by the system or the computer (for example, the CPU or MPU) of the apparatus. In this case, the program and the storage medium storing this program constitute the present invention.

<Fourth Embodiment>

An exposure apparatus 100 which transfers the pattern of a mask illuminated with light from an illumination optical system onto a wafer will be described with reference to FIG. 16. FIG. 16 is a schematic block diagram showing the configuration of the exposure apparatus 100. Although the exposure apparatus 100 is a step-and-scan exposure apparatus in this embodiment, it can also adopt the step-and-repeat type or other exposure types.

The exposure apparatus 100 includes an illumination apparatus 110, a mask stage (not shown) which supports a mask 120, a projection optical system 130, and a wafer stage (not shown) which supports a wafer 140.

The illumination apparatus 110 includes a light source 160 and illumination optical system 180, and illuminates the mask 120 on which a circuit pattern to be transferred is formed. The light source 160 uses, for example, an excimer laser such as an ArF excimer laser having a wavelength of about 193 nm or a KrF excimer laser having a wavelength of about 248 nm. However, the type and number of light sources 160 are not limited to specific examples, and an $F_2$ laser having a wavelength of about 157 nm or a narrowband mercury lamp, for example, can also be used as the light source 160. The illumination optical system 180 illuminates the mask 120 with light from the light source 160, and forms an effective light source determined in accordance with the determination method of the first, second, or third embodiment. The illumination optical system 180 includes a routing optical system 181, beam shaping optical system 182, polarization control unit 183, phase control unit 184, exit angle control optical element 185, relay optical system 186, and multi-beam generation unit 187. The illumination optical system 180 also includes a polarization state adjusting unit 188, computer generated hologram 189, relay optical system 190, aperture 191, zoom optical system 192, multi-beam generation unit 193, aperture stop 194, and irradiation unit 195.

The routing optical system 181 deflects and guides light from the light source 160 to the beam shaping optical system 182. The beam shaping optical system 182 converts the aspect ratio of the cross-sectional shape of the light from the light source 160 into a predetermined value (for example, converts this cross-sectional shape from a rectangle into a square). The beam shaping optical system 182 forms a light beam having a size and angle of divergence required to illuminate the multi-beam generation unit 187.

The polarization control unit 183 is implemented by, for example, a linear polarizer and has a function of removing unnecessary polarized components. The light from the light source 160 can be effectively converted into predetermined linearly polarized light by minimizing the amount of polarized components removed (shielded) using the polarization control unit 183. The phase control unit 184 generates a phase difference of $\lambda/4$ in the light linearly polarized by the polarization control unit 183, thereby converting it into circularly polarized light. The exit angle control optical element 185 is implemented by, for example, an optical integrator (for example, a fly-eye lens formed by a plurality of microlenses or fiber) and outputs light at a predetermined angle of divergence. The relay optical system 186 focuses the light emerging from the exit angle control optical element 185 on the multi-beam generation unit 187. The exit surface of the exit angle control optical element 185 and the incident surface of the multi-beam generation unit 187 are arranged in a Fourier transform relationship (arranged to serve as the object plane and the pupil plane, respectively, or serve as the pupil plane and the image plane, respectively) via the relay optical system 186. The multi-beam generation unit 187 is implemented by an optical integrator for uniformly illuminating the polarization state adjusting unit 188 and computer generated hologram 189. A secondary light source is formed on the exit surface of the multi-beam generation unit 187 by a plurality of point light sources. The light emerging from the multi-beam generation unit 187 enters the polarization state adjusting unit 188 as circularly polarized light.

The polarization state adjusting unit 188 generates a phase difference of $\lambda/4$ in the light circularly polarized by the phase control unit 184, thereby converting it into linearly polarized light having a predetermined polarization direction. The light emerging from the polarization state adjusting unit 188 impinges as linearly polarized light on the computer generated hologram 189 which functions as a diffractive optical element. Although the polarization state adjusting unit 188 is placed on the light source side with respect to the computer generated hologram 189 in this embodiment, the polarization state adjusting unit 188 and the computer generated hologram 189 may be interchanged with each other. Also, when the polarization state adjusting unit 188 is implemented by an SWS (Sub-Wavelength Structure), one element can have the functions of both a polarization state adjusting unit and a diffractive optical element (that is, the polarization state adjusting unit 188 can be formed integrally with the diffractive optical element).

The computer generated hologram 189 forms an effective light source (light intensity distribution), determined in accordance with the determination method of the first, second, or third embodiment, at the position of the aperture 191 via the relay optical system 190. The computer generated hologram 189 can also form, for example, annular illumination or quadrupole illumination, and can implement, for example, tangential polarization or radial polarization as well in cooperation with the polarization state adjusting unit 188. A plurality of computer generated holograms 189 which form different effective light sources as in this case are arranged on a switch unit such as a turret. Various effective light sources can then be formed by placing in the optical path of the illumination optical system 180 the computer generated hologram 189 corresponding to the effective light source determined in accordance with the determination method of the first, second, or third embodiment.

The aperture 191 has a function of passing only the effective light source (light intensity distribution) formed by the computer generated hologram 189. The computer generated hologram 189 and aperture 191 are arranged in a Fourier transform relationship. The zoom optical system 192 enlarges the effective light source formed by the computer generated hologram 189 at a predetermined magnification, and projects it onto the multi-beam generation unit 193. The multi-beam generation unit 193 is placed on the pupil plane of the illumination optical system 180, and forms on the exit surface a light source image (effective light source) corresponding to the light intensity distribution formed at the position of the aperture 191. In this embodiment, the multi-beam generation unit 193 is implemented by an optical integrator such as a fly-eye lens or a cylindrical lens array. Note that the aperture stop 194 is placed near the exit surface of the multi-beam generation unit 193. The irradiation unit 195 includes, for example, a condenser optical system and illuminates the mask 120 using the effective light source formed on the exit surface of the multibeam generation unit 193.

The mask 120 has a pattern to be transferred onto the wafer 140. Note that when the determination method in the first embodiment is used as a determination method of determining the exposure conditions of the exposure apparatus 100, the mask 120 has a pattern, which corresponds to a mask pattern determined in accordance with the determination method of the first embodiment, as a pattern to be transferred onto the wafer 140. The mask 120 is supported and driven by the mask stage (not shown). Light diffracted by the mask 120 is projected onto the wafer 140 via the projection optical system 130. Since the exposure apparatus 100 is a step-and-scan exposure apparatus, it transfers the pattern of the mask 120 onto the wafer 140 by scanning them.

The projection optical system 130 projects the pattern of the mask 120 onto the wafer 140. Also, the aberration of a projection optical system, which is determined in accordance with the determination method of the first, second, or third embodiment, is set in the projection optical system 130. The projection optical system 130 can use a dioptric system, a catadioptric system, or a catoptric system.

The wafer 140 is a substrate onto which the pattern of the mask 120 is projected (transferred), and is supported and driven by the wafer stage (not shown). However, the wafer 140 can be substituted with a glass plate or other substrates. The wafer 140 is coated with a resist.

In exposure, light from the light source 160 illuminates the mask 120 via the illumination optical system 180. The light which bears the information of the pattern of the mask 120 forms an image on the wafer 140 via the projection optical system 130. At this time, the exposure conditions determined in accordance with the determination method of the first, second, or third embodiment are set in the exposure apparatus 100, as described above. Hence, the exposure apparatus 100 can provide a high-quality device (for example, a semiconductor device, an LCD device, an image sensing device (for example, a CCD), or a thin-film magnetic head) with a high throughput and good economic efficiency. Note that the device is fabricated through a step of exposing a substrate (for example, a wafer or a glass plate) coated with a photoresist (photosensitive agent) using the exposure apparatus 100, a step of developing the exposed substrate, and subsequent known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-149496 filed on Jul. 5, 2011, which is hereby incorporated by reference herein in its entirety.

What is claimed is:

1. A determination method of determining exposure conditions used for an exposure method using an exposure apparatus including an illumination optical system which illuminates a mask, and a projection optical system which projects a pattern of the mask onto a substrate, to be set in the exposure apparatus for illuminating the mask and projecting the pattern of the mask onto the substrate, the method comprising:
   a first step of setting an unoptimized illumination parameter for a light intensity distribution formed on a pupil plane of the illumination optical system, and an unoptimized aberration parameter for an aberration of the projection optical system;
   a second step of calculating an image performance of an optical image of the pattern of the mask, which is formed in an image plane of the projection optical system in correspondence with the pattern of the mask to be placed on an object plane of the projection optical system, using the unoptimized illumination parameter and the unoptimized aberration parameter;
   a third step of repeating the calculating the image performance of the second step while changing both of a value of the unoptimized illumination parameter and a value of the unoptimized aberration parameter; and
   a fourth step of determining a value of the illumination parameter and a value of the aberration parameter, based on the results of the image performance calculated while changing both of the value of the unoptimized illumination parameter and the value of the unoptimized aberration parameter, thereby determining, as the exposure conditions, the light intensity distribution formed on the pupil plane of the illumination optical system and the aberration of the projection optical system, which are defined by the determined value of the illumination parameter and the determined value of the aberration parameter, respectively,
   wherein the exposure method comprises a step of illuminating the mask and exposing the substrate under the determined exposure conditions.

2. The method according to claim 1, wherein
   in the first step, a mask parameter is set for the pattern of the mask to be placed on the object plane of the projection optical system,
   in the second step, the image performance is calculated using the mask parameter;
   in the third step, the second step is repeated while changing a value of the mask parameter; and
   in the fourth step, a value of the mask parameter, a value of the illumination parameter, and a value of the aberration parameter are determined, thereby determining, as the exposure conditions, the pattern of the mask, the light intensity distribution formed on the pupil plane of the illumination optical system, and the aberration of the projection optical system, which are defined by the determined value of the mask parameter, the determined value of the illumination parameter, and the determined value of the aberration parameter, respectively.

3. The method according to claim 1, wherein in the first step, a parameter representing an amount of aberration to be set in the projection optical system is set as the aberration parameter.

4. The method according to claim 1, wherein in the first step, a parameter representing an amount of aberration to be adjusted from an initial amount of aberration set in the projection optical system is set as the aberration parameter.

5. The method according to claim 4, wherein the parameter representing the amount of aberration to be adjusted is expressed as a function of a distance from an optical axis of the projection optical system.

6. The method according to claim 1, wherein in the first step, a parameter representing an amount of driving of an optical element which forms the projection optical system is set as the aberration parameter.

7. The method according to claim 1, wherein the image performance includes at least one of a depth of focus on the image plane of the projection optical system, a difference between a dimension of the target pattern and a dimension of the optical image of the pattern of the mask, which is formed on the image plane of the projection optical system, and an exposure margin of the optical image of the pattern of the mask, which is formed on the image plane of the projection optical system.

8. The method according to claim 1, further comprising a step of setting an evaluation position in the image plane of the projection optical system to evaluate the optical image of the pattern of the mask, which is formed on the image plane of the projection optical system, wherein, in the fourth step, the image performance of the optical image of the pattern of the mask, which is formed at the evaluation position in correspondence with the pattern of the mask, is calculated.

9. The method according to claim 1, wherein, in the fourth step, the value of the illumination parameter and the value of the aberration parameter are determined so that the image performance satisfies an evaluation criterion set for a target pattern to be formed on the image plane of the projection optical system.

10. A non-transitory computer-readable storage medium storing a program for causing a computer to execute a determination method of determining exposure conditions used for an exposure method using an exposure apparatus including an illumination optical system which illuminates a mask, and a projection optical system which projects a pattern of the mask onto a substrate, to be set in the exposure apparatus for illuminating the mask and projecting the pattern of the mask onto the substrate, the program causing the computer to execute:

a first step of setting an unoptimized illumination parameter for a light intensity distribution formed on a pupil plane of the illumination optical system, and an unoptimized aberration parameter for an aberration of the projection optical system;

a second step of calculating an image performance of an optical image of the pattern of the mask, which is formed in an image plane of the projection optical system in correspondence with the pattern of the mask to be placed on an object plane of the projection optical system, using the unoptimized illumination parameter and the unoptimized aberration parameter;

a third step of repeating the calculating the image performance of the second step while changing both of a value of the unoptimized illumination parameter and a value of the unoptimized aberration parameter; and a fourth step of determining a value of the illumination parameter and a value of the aberration parameter, based on the results of the image performance calculated while changing both of the value of the unoptimized illumination parameter and the value of the unoptimized aberration parameter, thereby determining, as the exposure conditions, the light intensity distribution formed on the pupil plane of the illumination optical system and the aberration of the projection optical system, which are defined by the determined value of the illumination parameter and the determined value of the aberration parameter, respectively, wherein the exposure method comprises a step of illuminating the mask and exposing the substrate under the determined exposure conditions.

11. An information processing apparatus configured to determine exposure conditions used for an exposure method using an exposure apparatus including an illumination optical system which illuminates a mask, and a projection optical system which projects a pattern of the mask onto a substrate, to be set in the exposure apparatus for illuminating the mask and projecting the pattern of the mask onto the substrate, the information processing apparatus comprising:

a storage device; and a processor configured to execute computer executable instructions recorded on the storage device, the computer executable instructions including instructions, that when executed by the processor, cause the information processing apparatus to:

set an unoptimized illumination parameter for a light intensity distribution formed on a pupil plane of the illumination optical system, and an unoptimized aberration parameter for an aberration of the projection optical system;

calculate an image performance of an optical image of the pattern of the mask, which is formed in an image plane of the projection optical system in correspondence with the pattern of the mask to be placed on an object plane of the projection optical system, using the unoptimized illumination parameter and the unoptimized aberration parameter;

repeat the calculate the image performance of the optical image of the pattern of the mask while changing both of a value of the unoptimized illumination parameter and a value of the unoptimized aberration parameter; and determine a value of the illumination parameter and a value of the aberration parameter, based on the results of the image performance calculated while changing both of the value of the unoptimized illumination parameter and the value of the unoptimized aberration parameter, thereby determining, as the exposure conditions, the light intensity distribution formed on the pupil plane of the illumination optical system and the aberration of the projection optical system, which are defined by the determined value of the illumination parameter and the determined value of the aberration parameter, respectively, wherein the exposure method comprises a step of illuminating the mask and exposing the substrate under the determined exposure conditions.

* * * * *